(12) United States Patent
Berget et al.

(10) Patent No.: US 8,994,696 B2
(45) Date of Patent: Mar. 31, 2015

(54) ACOUSTIC TOUCH APPARATUS WITH ADDRESSABLE MULTI-TOUCH CAPABILITY

(71) Applicant: Elo Touch Solutions, Inc., Menlo Park, CA (US)

(72) Inventors: Damien Berget, Sunnyvale, CA (US); Joel Kent, Fremont, CA (US)

(73) Assignee: Elo Touch Solutions, Inc., Menlo Park, CA (US)

( * ) Notice: Subject to any disclaimer, the term of this patent is extended or adjusted under 35 U.S.C. 154(b) by 135 days.

(21) Appl. No.: 13/663,936

(22) Filed: Oct. 30, 2012

(65) Prior Publication Data

US 2014/0118307 A1    May 1, 2014

(51) Int. Cl.
*G06F 3/043* (2006.01)
*H03H 9/02* (2006.01)
(52) U.S. Cl.
CPC ......... *G06F 3/0433* (2013.01); *H03H 9/02535* (2013.01)
USPC ...................................... 345/177; 178/18.03

(58) Field of Classification Search
CPC ................ G06F 3/043–3/0436; H03H 9/0004; H03H 9/0028; H03H 9/02535; H03H 9/0296; H03H 9/0042; H03H 9/0061; H03H 9/0076
USPC ........ 345/177; 178/18.03; 310/313 R–313 D, 310/322, 334
See application file for complete search history.

(56) References Cited

U.S. PATENT DOCUMENTS 5,854,450 A * 12/1998 Kent .......................... 178/18.04
2011/0234545 A1* 9/2011 Tanaka et al. ................. 345/177

* cited by examiner

*Primary Examiner* — Liliana Cerullo
(74) *Attorney, Agent, or Firm* — Alston & Bird LLP

(57) ABSTRACT

An acoustic touch apparatus (100) that utilizes the transfer of surface acoustic waves from one surface (115), through the touch substrate (105), to another surface (110) and a grid of sensitivity zones (Z) formed on one of the surfaces (115) to enable multi-touch capabilities.

12 Claims, 25 Drawing Sheets

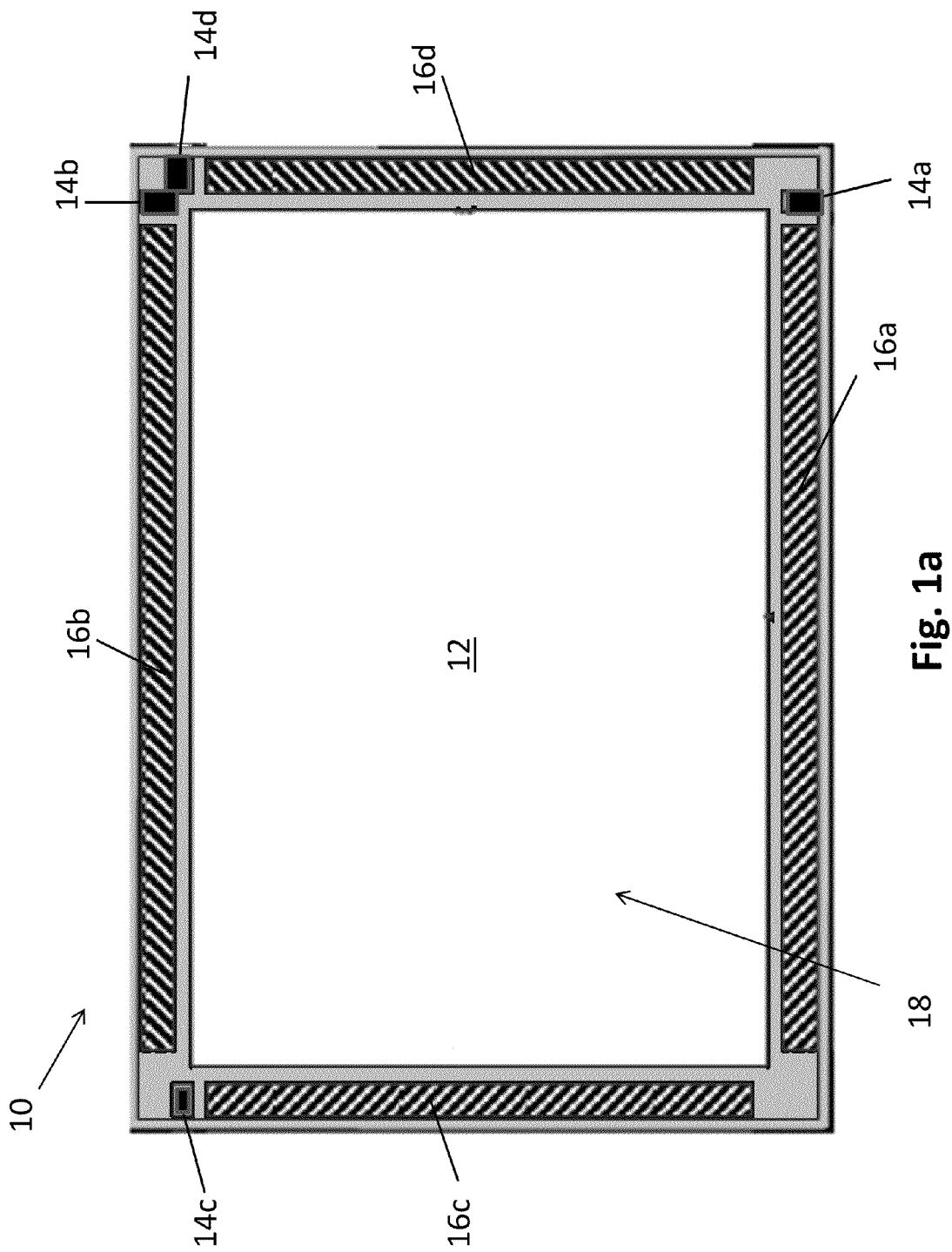

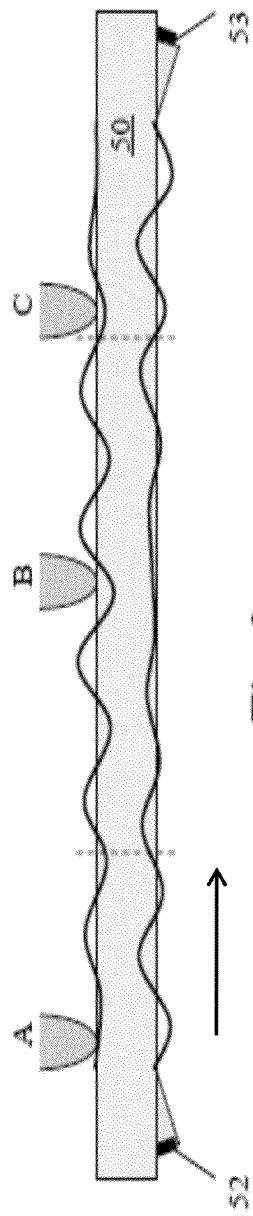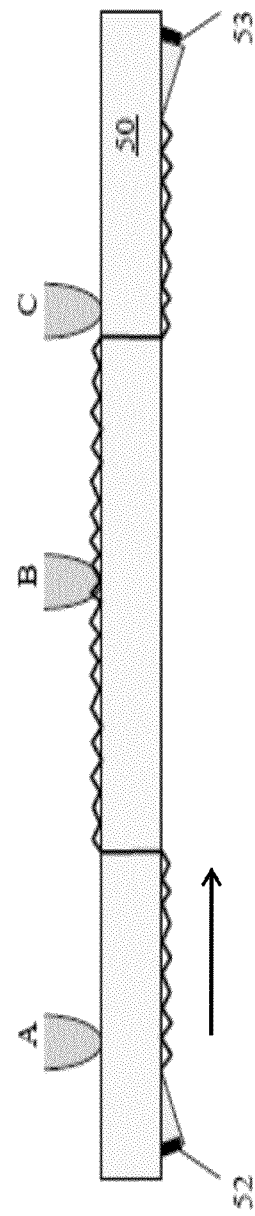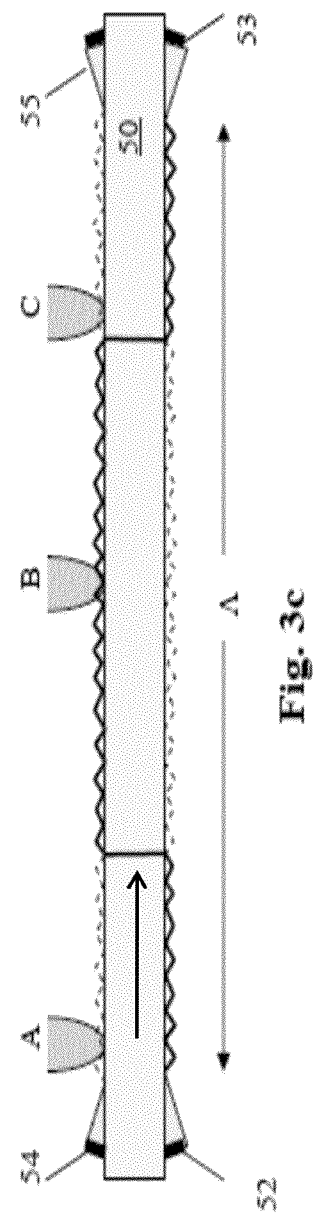

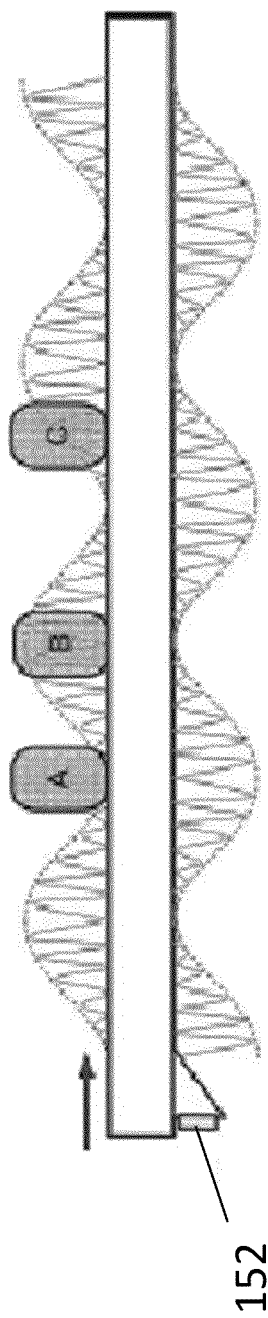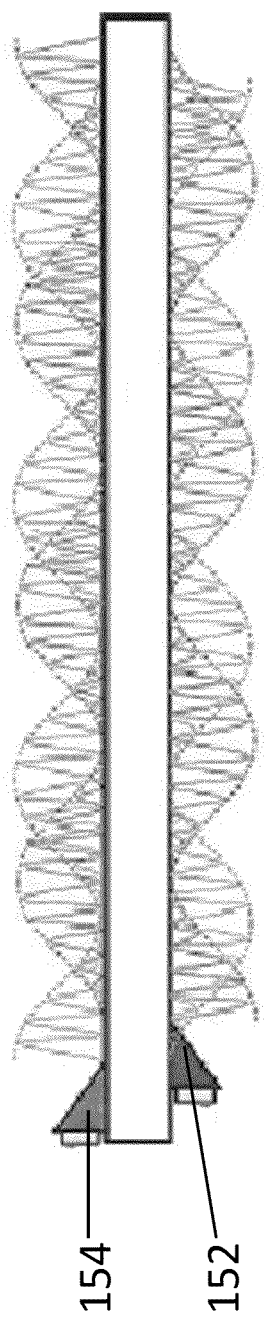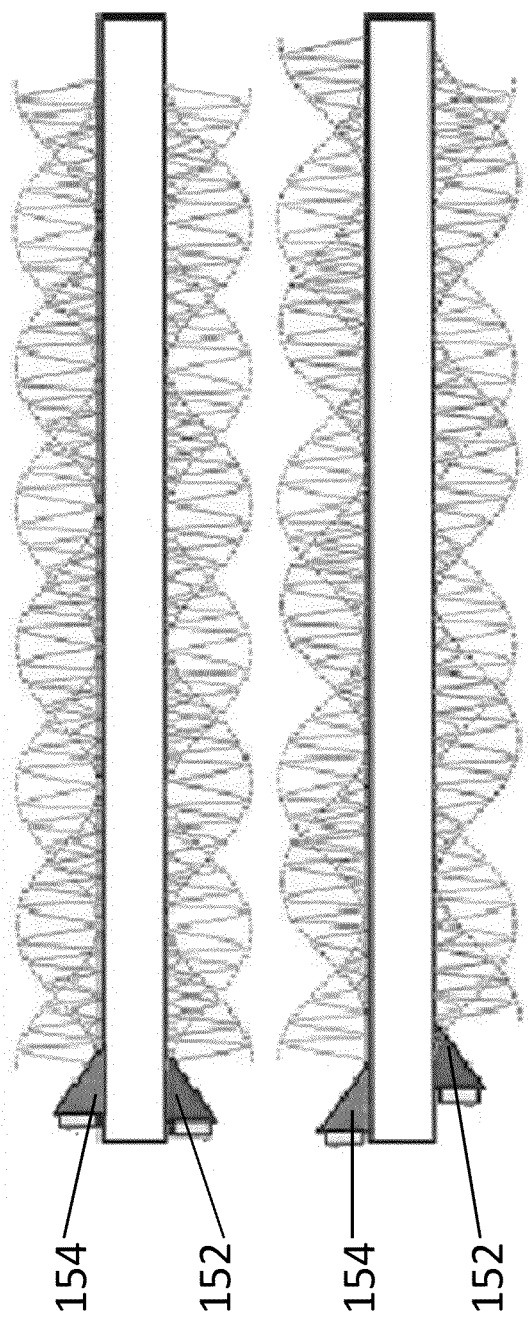

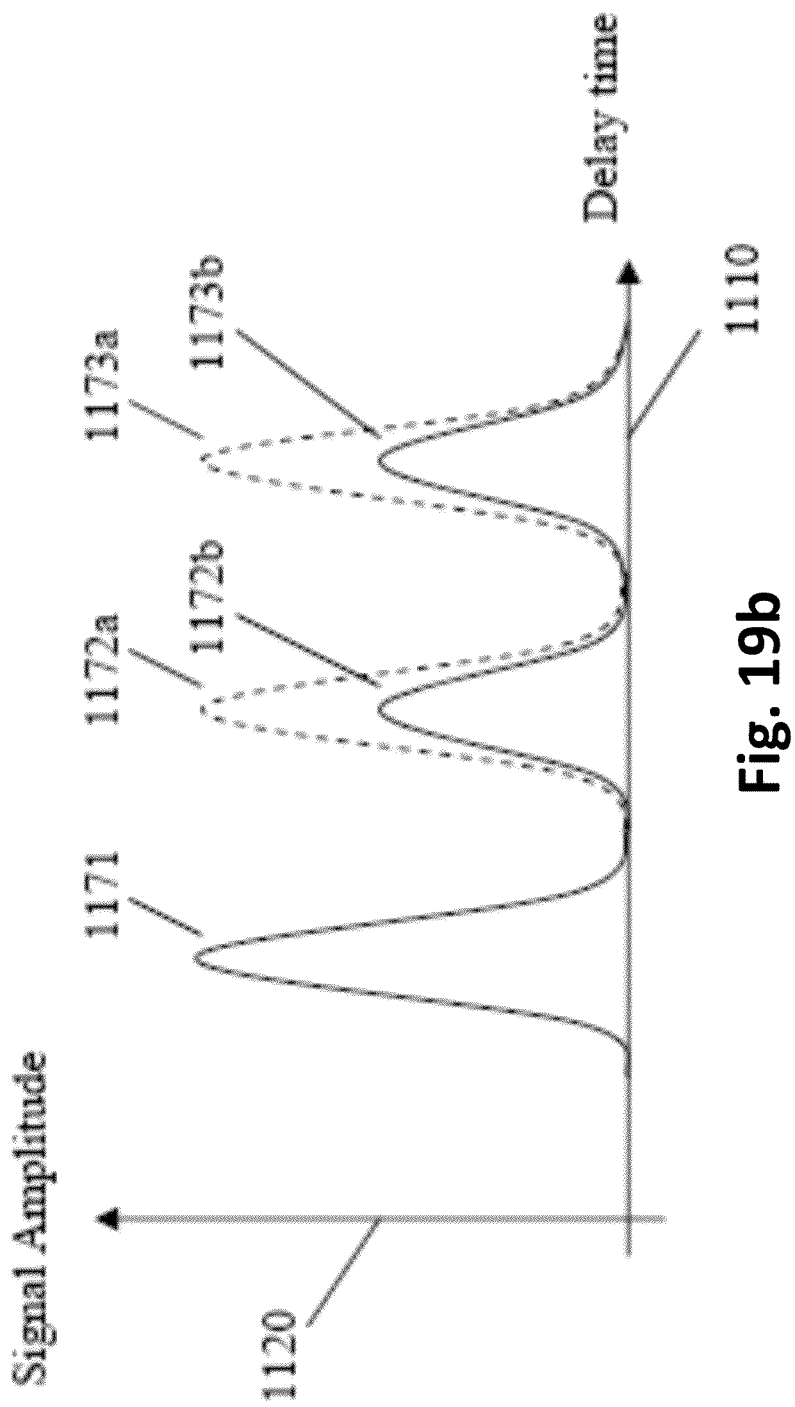

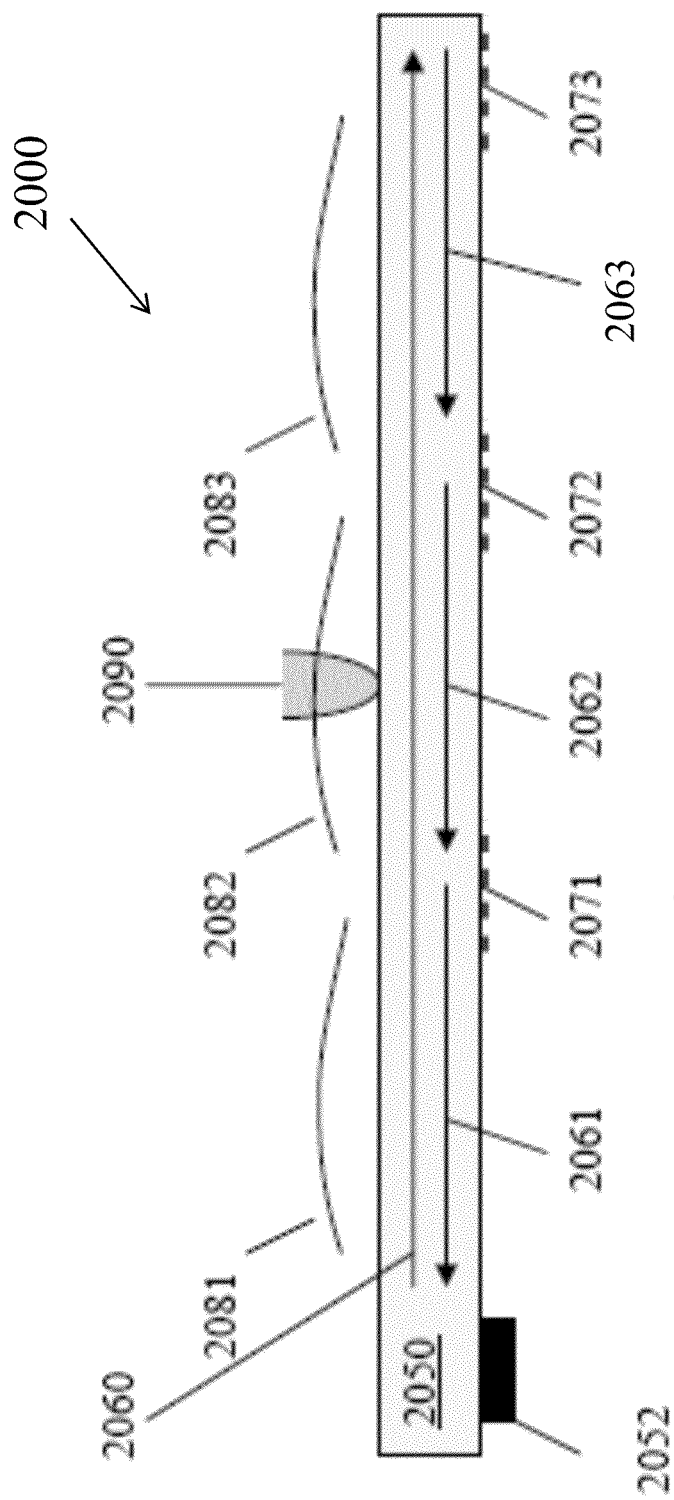

ACOUSTIC TOUCH APPARATUS WITH ADDRESSABLE MULTI-TOUCH CAPABILITY

FIELD OF THE INVENTION

This invention generally relates to touch sensor systems and, more particularly to, surface acoustic wave (SAW) touchscreens with multi-touch capability.

BACKGROUND

Touch sensor systems, such as touchscreens or touch monitors, can act as input devices for interactive computer systems used for various applications, for example, information kiosks, order entry systems, video displays, etc. Such systems may be integrated into a computing device, thus providing interactive touch capable computing devices, including computers, electronic book readers, mobile communications devices, trackpads, and touch sensitive surfaces more generally.

Generally, touch sensor systems enable the determination of a position on the surface of a substrate via a user's touch of the surface. The touch substrate is typically made of some form of glass which overlies a computer or computing device display, like a liquid crystal display (LCD), a plasma display, etc. The touch sensor system is operatively connected to the device display so that it also enables the determination of a position on the device display and, moreover, of the appropriate control action of a user interface shown on the display. Alternatively, the touch substrate may be an opaque material such as for trackpad applications where the display may be located away from the touch sensor.

Touch sensor systems may be implemented using different technologies. Acoustic touch sensors, such as ultrasonic touch sensors using surface acoustic waves, are currently one of the major touch sensor technologies and many types of acoustic touch sensors now exist. For example, a "non-Adler-type" acoustic touch sensor uses a number of transducers per coordinate axis of the sensor substrate to spatially spread a transmitted surface acoustic wave signal and determine the touch surface coordinates by analyzing spatial aspects of the wave perturbation from a touch of the touch surface. An "Adler-type" acoustic touch sensor uses only two transducers per coordinate axis, in combination with reflective arrays, to spatially spread a transmitted surface acoustic wave signal and determine the touch surface coordinates by analyzing temporal aspects of a wave perturbation from a touch. Generally, touching the substrate surface at a point causes a loss of energy by the surface acoustic waves passing through the point of touch. This is manifested as an attenuation of the surface acoustic waves. Detection circuitry associated with each receiving transducer detects the attenuation as a perturbation in the surface acoustic wave signal and performs a time delay analysis of the data to determine the surface coordinates of a touch on the substrate. This type of sensor is shown in FIG. 1 and described in more detail below.

Historically, the operative elements of an acoustic touch sensor, i.e., the transducers and reflective arrays, which are on the front surface of the substrate, have been covered and hidden from view by a protective bezel provided by the housing of the touch sensor or the device integrating the sensor. Current trends eliminate the bezel in favor of flush surroundings of touch area, even for larger-sized devices. Moreover, possible future applications of touch technology, such as turning passive objects like glass table tops into touch input devices and endowing robots with a sense of touch in their exterior shells, further motivate moving the operative elements from the exterior touch sensing surface of the touch substrate to the protected and hidden interior surfaces of the substrate. Acoustic touch sensors may utilize a rounded-substrate-edge approach to obtain such a zero-bezel or bezel-less design. This type of sensor is also described in more detail below.

Recently, acoustic touch sensors having multi-touch capability have been introduced into the commercial marketplace. Multi-touch capability is generally defined as the ability of a touch sensor to sense or recognize two or more (i.e., multiple) simultaneous touch points. Gestures based on multiple simultaneous touch points include, for example, pinching gestures, parallel line swipes, and pivoting movements. To date, acoustic touch sensors, such as the IntelliTouch™ Plus touch sensors by Elo Touch Solutions, Inc. have been able to deliver dual touch performance. Certain other touch technologies are providing even higher levels of multi-touch performance. The competition between the different technologies and the increase of system applications using multi-touch is now increasing the expectation and demand by users and designers for good touch performance not only for dual touches but also for three or more simultaneous touches.

A difficulty for acoustic touch sensors to support two or more simultaneous touches rests on such sensors not being able to acquire sufficient, clear coordinate information to match respective X coordinates with the respective corresponding Y coordinates of the multiple touches. The difficulties increase as the number of simultaneous touches increases.

SUMMARY OF THE INVENTION

The present invention obviates the above problems by providing an acoustic touch apparatus that distinguishes simultaneous touches in a touch region, comprising a substrate that has two opposite surfaces and that is adapted to propagate surface acoustic waves along each opposite surface; a transmitting element that is adapted to transmit propagating surface acoustic waves for each opposite surface; and a receiving element that is adapted to receive the propagating surface acoustic waves for each opposite surface, one of said opposite surfaces having the touch region defined thereon and said substrate being adapted to transfer, through the substrate, surface acoustic waves between the opposite surfaces so as to alternate in the touch region the propagating surface acoustic waves from each opposite surface. The transmitting element may comprise an acoustic transducer that generates propagating surface acoustic waves and a reflector array that reflects the generated propagating surface acoustic waves onto each opposite surface, and the receiving element may comprise a reflector array that reflects surface acoustic waves propagating on each opposite surface and an acoustic transducer that receives the reflected propagating surface acoustic waves.

The touch region may provide signal information for each touch to the receiving element so that the apparatus may determine positional information of a respective touch on said touch region, said signal information being based on signal perturbations of each of the alternating propagating surface acoustic waves induced by a respective touch. In such case, the signal information may comprise a comparison of the signal attenuations of the alternating propagating surface acoustic waves induced by a respective touch. Alternatively, the signal information may comprise a comparison of the powers of signal attenuations of the alternating propagating surface acoustic waves induced by a respective touch.

The touch region may also be adapted to form first probable zones of touch contact by the propagating surface acoustic waves from one opposite surface and second probable zones of touch contact by the propagating surface acoustic waves from the other opposite surface, said first and second probable zones being alternately formed between the transmitting element and the receiving element. The first and second probable zones of touch contact may then provide respective signal information for each touch to the receiving element that distinguish between simultaneous touches on respective locations of said first and second probable zones, said signal information based on signal perturbations of each of the alternating propagating surface acoustic waves induced by a respective touch. The signal information may comprise a comparison of signal perturbations of the alternating propagating surface acoustic waves induced by a respective touch or a comparison of the powers of signal perturbations of the alternating propagating surface acoustic waves induced by a respective touch. Also, the apparatus may further comprise a transmitting element and an associated receiving element for each axis coordinate of the touch region, said touch region being adapted to form first and second probable zones of touch contact for each axis coordinate. In such case, a respective probable zone of touch contact for a first axis coordinate may provide signal information for each touch that distinguishes between simultaneous touches on different locations of a respective probable zone of touch contact for a second axis coordinate.

The present invention also provides an acoustic touch sensor system that comprises a substrate having a top surface, a bottom surface, and a curved connecting surface formed between said top surface and said bottom surface, said substrate being adapted in a peripheral region to propagating surface acoustic waves along substrate surfaces and in a central region to permit the transfer, through the substrate, of surface acoustic waves between the top and the bottom surfaces; a first transmitting element disposed on the peripheral region of the bottom surface; a first receiving element disposed on the peripheral region of the bottom surface, the transmitting element and the receiving element disposed on opposite sides of the central region; and a controller that excites the first transmitting element to generate propagating surface acoustic waves and that analyzes the propagating surface acoustic waves received by the first receiving element to determine coordinate information of a touch in the central region on the top surface, said first transmitting element being adapted to generate propagating surface acoustic waves in a first direction toward the central region and in a second direction toward a proximate curved connecting surface and said first receiving element being adapted to receive propagating surface acoustic waves from the central region and from a proximate curved connecting surface and said substrate forming in the central region a wave propagation path that oscillates a respective propagating surface acoustic wave between the top surface and the bottom surface. The first transmitting element may comprise a first transmitting acoustic wave transducer disposed on the peripheral region on one side of the substrate, a second transmitting acoustic wave transducer disposed on the peripheral region on an opposite side of the substrate, and a transmitting reflective array that is disposed on the peripheral region between the first and second transmitting acoustic wave transducers and is adapted to reflect generated propagating surface acoustic waves in a first direction toward the central region and in a second direction toward a proximate curved connecting surface, and the first receiving element may comprise a first receiving acoustic wave transducer disposed on the peripheral region on one side of the substrate, a second receiving acoustic wave transducer disposed on the peripheral region on an opposite side of the substrate, and a receiving reflective array that is disposed on the peripheral region between the first and second receiving acoustic wave transducers and is adapted to receive propagating surface acoustic waves from the central region and from a proximate curved connecting surface. The system may further comprise a second transmitting element and a second receiving element disposed on the other two opposing sides of the central region of the substrate in a similar manner as the respective first transmitting and receiving elements, each pair of elements being utilized to define a respective axis coordinate of the central region on the top surface. Also, the peripheral region may be adapted to suppress the transfer, through the substrate, of surface acoustic waves between the top and the bottom surfaces.

The transmitting reflective array and the receiving reflective array each may comprise a plurality of segments that are each configured to have reflector elements facing in the opposite direction from the respective reflector elements of the preceding and the succeeding segment. In such case, the plurality of segments of the transmitting reflective array and the receiving reflective array may each be disposed in a non-overlapping zigzag manner between the respective transducers. Alternatively, the plurality of segments of the transmitting reflective array and the receiving reflective array may each be disposed in an overlapping zigzag manner between the respective transducers.

Also, the transmitting reflective array and the receiving reflective array may each comprise at least two sets of segments that are disposed proximate one another, each segment being configured to have reflector elements facing in the opposite direction from the respective reflector elements of the preceding and the succeeding segment in a respective set, and each set being tuned to a different one of a plurality of frequencies of surface acoustic waves generated by the transmitting acoustic wave transducers. Each set of segments may be disposed in a non-overlappping manner between the respective transducers and the two sets of segments are disposed in an interlocking manner with one another.

Also, the transmitting and receiving reflective arrays may be constant density arrays and the controller may equalize the energy distribution of the propagating surface acoustic waves. Alternatively, the transmitting reflective arrays may be constant density arrays and the receiving reflective arrays may have varying reflector density that compensate for differences in energy density of the propagating surface acoustic waves. In such case, the receiving reflective arrays of lesser reflector density may receive propagating surface acoustic waves of higher energy density and receiving reflective arrays of higher reflector density may receive propagating surface acoustic waves of lower energy density.

Also, the controller may analyze the ratio of signal attenuations between the surface acoustic waves propagating in the first and second directions and the power of attenuation of each wave to determine coordinate information of a touch. Also, the transmitting element may generate the surface acoustic waves propagating in the first and second directions in an out-of-phase relationship and the controller may analyze the power of attenuation of each wave to determine coordinate information of a touch.

The present invention also provides an acoustic touch sensor system having multi-touch capability comprising a substrate adapted to propagate surface acoustic waves along opposite surfaces and to transfer, through the substrate, surface acoustic waves between the surfaces and to form a touch sensitivity pattern on a touch region on one of the opposite surfaces based on the alternating surface acoustic waves propagating through the touch region; a transmitter-reflector arrangement adapted to transmit surface acoustic waves on each opposite surface; a receiver-reflector arrangement adapted to receive surface acoustic waves from each opposite surface and to produce a touch response signal in response to a touch on the touch region; and a controller that operates on the touch response signals and determines positional information of the touch on the touch region from the touch response signals. The touch sensitivity pattern may define a probable zone of touch for each alternating surface acoustic wave propagating through the touch region that permits the controller to distinguish between touches in different zones and between touches in different touch region locations of the same zone.

The present invention also provides an acoustic touch sensor system, comprising a substrate having a first surface with a touch region and a second surface opposite the first surface, the substrate being adapted to propagate surface acoustic waves along each of the surfaces and to transfer, through the substrate, surface acoustic waves between the surfaces; a transmitter adapted to transmit respective surface acoustic waves on each surface that alternate propagating in the touch region as the surface acoustic waves transfer between the surfaces; a receiver adapted to receive surface acoustic waves from each surface and to produce touch response signals in response to a touch on the touch region; and a controller that operates on the touch response signals and determines positional information of the touch on the touch region from the touch response signals. The controller may determine a first positional coordinate of the touch on the touch region based on delay time measurements of received surface acoustic waves and a second positional coordinate, orthogonal to the first positional coordinate, based on perturbation measurements of the alternating propagating surface acoustic waves. Alternatively, the controller may determine a positional coordinate of the touch on the touch region, relative to the transmitter position, based on perturbation measurements of the alternating propagating surface acoustic waves. The controller may measure, for each of a plurality of transmitting frequencies, perturbations of the alternating propagating surface acoustic waves in response to the touch on the touch region to determine a positional coordinate of the touch on the touch region relative to the transmitter position, a respective positional coordinate being identified with a specific pattern of measurements across the plurality of transmitting frequencies.

Also, the transmitter may be adapted to transmit over a range of transmitting frequencies, an alternating propagation pattern being formed in the touch region for a respective transmitting frequency in the range, and the controller may be adapted to correspond a touch position on the touch region with a respective sequence of coded values derived from the alternating propagation patterns formed in the touch region for a plurality of transmitting frequencies in the range. A coded value for a respective alternating propagation pattern may represent whether the surface acoustic wave transmitted on the first surface or the surface acoustic wave transmitted on the second surface is more touch sensitive at a respective touch position in the touch region. Alternatively, a coded value for a respective alternating propagation pattern may represent a function of the ratio of a touch-induced perturbation of the surface acoustic wave transmitted on the first surface to a touch-induced perturbation of the surface acoustic wave transmitted on the second surface at a respective touch position in the touch region. In such case, the coded values for a respective alternating propagation pattern across touch positions in the touch region may form a continuous curve of ratio functions. The transmitter may be adapted to transmit in tone bursts of finite duration for a respective excitation frequency of the transmitter and the controller may be adapted to undertake digital signal processing of the touch response signals and non-touch response signals provided by the receiver to obtain perturbation information of the alternating propagating surface acoustic waves. The system may further comprise a transmitter and an associated receiver for each axis coordinate of the touch region and the controller may determine a first axis coordinate of the touch on the touch region based on perturbation measurements of the alternating propagating surface acoustic waves transmitted and received in the first axis coordinate direction and a second axis coordinate of the touch on the touch region based on perturbation measurements of the alternating propagating surface acoustic waves transmitted and received in the second axis coordinate direction.

BRIEF DESCRIPTION OF THE DRAWINGS

For a better understanding of the present invention, reference is made to the following description of exemplary embodiments thereof, and to the accompanying drawings, wherein:

FIG. 1a is a front plan view of a substrate of a typical surface acoustic wave touch sensor;

FIGS. 3a-3c are illustrations of touch zones created by top-bottom oscillation in a substrate;

FIGS. 8a-8c are illustrations of touch zones created by top-bottom oscillation (shown as a continuous wave) in a substrate;

FIG. 19b is a plot illustrating signals from the touch sensor of FIG. 19a;

FIG. 20a is a side view of an alternate embodiment of an acoustic touch sensor constructed in accordance with the present invention providing a linear array of touch button locations; and FIG. 20b is a plot illustrating signals from the touch sensor of FIG. 20a.

DETAILED DESCRIPTION OF SPECIFIC EMBODIMENTS OF THE INVENTION

Figure 1B:
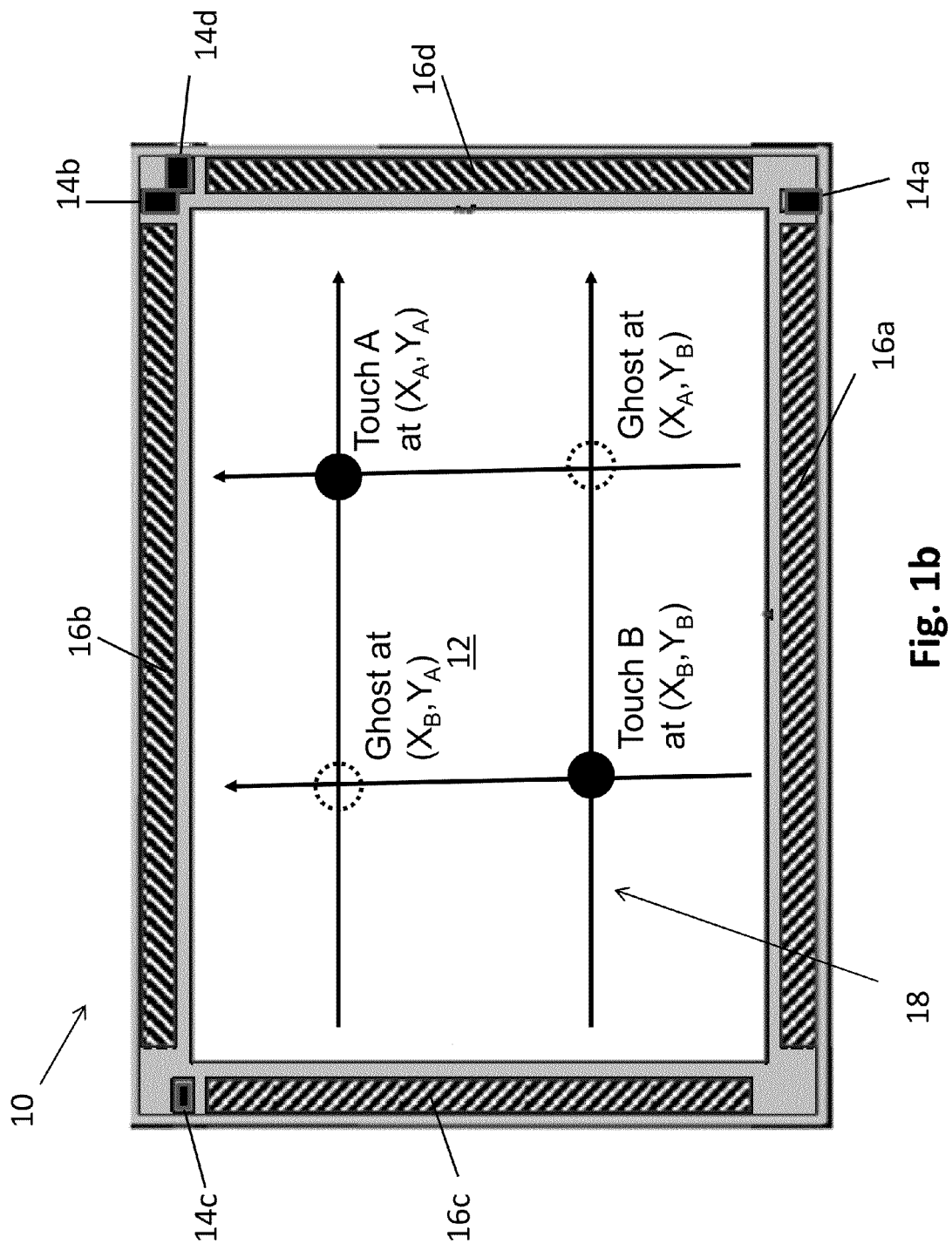
FIG. 1b is the sensor view of FIG. 1 that demonstrates a multi-touch ambiguity.

FIGS. 1a and 1b each show a front plan view of a substrate 12 of a typical "Adler-type" surface acoustic wave touch sensor 10. As noted above, the touch sensor 10 uses two transducers per coordinate axis to spatially spread a transmitted surface acoustic wave signal and determine the touch surface coordinates by analyzing temporal aspects of a wave perturbation from a touch. Accordingly, for the X coordinate axis, a first transmitting transducer 14a at a respective peripheral surface generates surface acoustic wave pulses that propagate through the substrate 12 across a perpendicular peripheral surface along which a first reflective grating or array 16a is disposed. The first reflective array 16a is adapted to reflect portions of a surface acoustic wave perpendicularly across the substrate 12 (across the so-called "the touch surface" 18) along plural parallel paths to a second reflective array 16b disposed on the opposite peripheral surface. The second reflective array 16b is adapted to reflect the surface acoustic wave along the peripheral surface to a first receiving transducer 14b at a respective perpendicular peripheral surface where the wave is received for processing. Similarly, for the Y coordinate axis, a second transmitting transducer 14c at a respective peripheral surface generates surface acoustic wave pulses that propagate through the substrate 12 across a perpendicular peripheral surface along which a third reflective grating or array 16c is disposed. The third reflective array 16c is adapted to reflect portions of a surface acoustic wave perpendicularly across the substrate 12 (i.e., the touch region or surface 18) along plural parallel paths to a fourth reflective array 16d disposed on the opposite peripheral surface. The fourth reflective array 16d is adapted to reflect the surface acoustic wave along the peripheral surface to a second receiving transducer 14d at a respective perpendicular peripheral surface where the wave is received for processing. The reflective arrays 16a, 16b associated with the X coordinate axis are perpendicular to the reflective arrays 16c, 16d associated with the Y coordinate axis so as to provide a grid pattern to enable two-dimensional coordinates of a touch on the substrate 12, and more specifically, the touch surface 18, to be determined.

Touching the touch surface 18 at a point causes a loss of energy by the surface acoustic waves passing through the point of touch. This is manifested as an attenuation of the surface acoustic waves. Detection circuitry associated with each receiving transducer 14b, 14d detects the attenuation as a perturbation in the surface acoustic wave signal and performs a time delay analysis of the data to determine the surface coordinates of a touch on the touch surface 18. As noted above, problems can arise when two or more touches are present at the same time. For example, as illustrated in FIG. 1b, a touch at location A simultaneous with a touch at location B results in attenuated surface acoustic waves propagating across the touch surface 18 with X coordinates $X_A$ and $X_B$ as well as Y coordinates $Y_A$ and $Y_B$. Without means to reliably determine which X coordinate is associated with which Y coordinate, erroneous or "ghost" touch position coordinates $(X_A, Y_B)$ and $(X_B, Y_A)$ are falsely generated.

Varying the touch sensitivity along the acoustic path across the touch region of the substrate may be beneficial in acquiring additional coordinate information to distinguish between real touch points and ghost touches. This would enable the detection circuitry to match a respective X coordinate with a respective corresponding Y coordinate for each touch point of multiple simultaneous touches.

One method of modulating the touch sensitivity along the acoustic path along the touch region would be to utilize a unique property of surface acoustic waves generated for an acoustic touch sensor. Specifically, surface acoustic waves propagating on one surface of a substrate may transfer, under certain circumstances, through the substrate to the other surface. Generally, this transfer can occur when the depth of the substrate is sufficiently small relative to the Rayleigh wavelength. The current standard used in acoustic touch sensors is approximately 3 mm, thick substrate. It has been previously reported that the typical substrate (i.e., soda-lime glass) of an acoustic touch sensor, using the standard transmitting frequency of 5.53 MHz, should be at least 2 mm thick for propagating surface acoustic waves, that is, at least 3.5 Rayleigh wavelengths thick. These propagating surface acoustic waves are maintained on the substrate surface of the transmitting transducer, much as surface waves on the ocean are maintained on the ocean surface, although in both cases wave motion and power penetrates some depth into the wave medium of glass or water. However, at certain smaller thicknesses, the surface acoustic wave energy becomes transferred (actually oscillates) between the two opposing surfaces of the substrate. This is further described in commonly-owned U.S. patent application Ser. No. 13/416,871 entitled, "Acoustic Touch Apparatus With Variable Thickness Substrate" filed on Mar. 9, 2012, which is hereby incorporated by reference, and commonly-owned U.S. patent application Ser. No. 13/416,940 entitled, "Acoustic Touch Apparatus With Multi-Touch Capability" filed on Mar. 9, 2012, which is hereby incorporated by reference.

Briefly, the transmitting transducers of an acoustic touch sensor normally produce a surface acoustic wave which is typically termed a Rayleigh wave. A Rayleigh wave has vertical and transverse wave components with substrate particles moving along an elliptical path in a vertical plane including the axis of wave propagation, and wave energy decreasing with increasing depth in the substrate. Mathematically, Rayleigh waves exist only in semi-infinite media. In plates or substrates of finite thickness, such as those used in acoustic touch sensors, the waves are more precisely termed quasi-Rayleigh waves, each of which comprises a superposition of equal portions of the lowest order symmetric and anti-symmetric Lamb wave modes $S_0$ and $A_0$. For substrates of thickness of interest for acoustic touch sensors, the $S_0$ Lamb wave mode is essentially a surface acoustic wave on the transmitting transducer (or top) surface simultaneously with an in-phase surface acoustic wave on the opposing (or bottom) surface, while the $A_0$ Lamb wave mode is similar except the surface acoustic wave on the bottom surface is out of phase with the surface acoustic wave on the top surface. A quasi-Rayleigh wave on the top surface is a positive superposition of the two wave modes (i.e., $S_0+A_0$) which cancels the surface acoustic wave on the bottom surface and a quasi-Rayleigh wave on the bottom surface is a negative superposition of the two wave modes (i.e., $S_0-A_0$) which cancels the surface acoustic wave on the top surface. A transmitted (or launched) pure $S_0$ or $A_0$ wave will forever remain a $S_0$ or $A_0$ wave, respectively, since each is a true mode of vibration. In contrast, neglecting glass attenuation, a launched top quasi-Rayleigh wave, which is not a true mode of vibration, will eventually convert into a bottom quasi-Rayleigh wave and the two waves will continue to oscillate back and forth in a beat pattern. This is because the wave modes $S_0$ and $A_0$ have slightly different phase velocities so that the $A_0$ phase relative to the $S_0$ phase continually changes and with enough distance $S_0+A_0$ becomes $S_0-A_0$ and then back again, repeatedly in a beat pattern. This is an example of the classical coupled oscillator system that occurs in many contexts. The result is surface wave energy is transferred back and forth between the top and bottom surfaces of the substrate, as indicated above.

Figure 2:
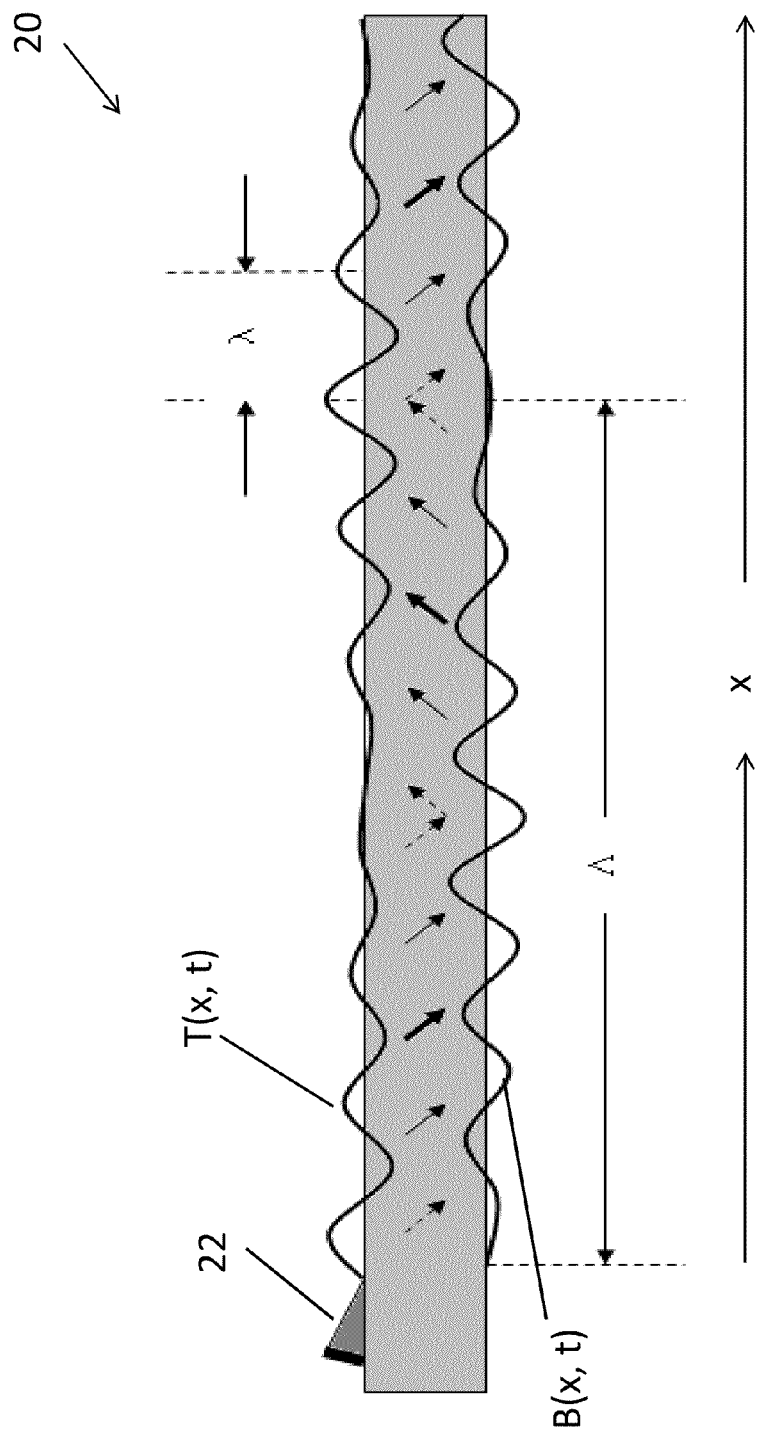
FIG. 2 is an illustration of top-bottom oscillation phenomenon in a thin substrate.

FIG. 2 is an illustration of this top-bottom oscillation for a thin substrate 20 that may be used in an acoustic touch sensor. Neglecting attenuation effects, if "x" is the distance of propagation away from a wedge transducer 22 continuously excited at frequency f, the wave amplitude (e.g. vertical particle displacement) on the top surface $T(x,t)$ and the wave amplitude on the bottom surface $B(x,t)$ will vary with position and time as follows, where $\lambda$ is the Rayleigh wavelength at frequency f and $\Lambda$ is a beat wavelength that characterizes the oscillation of the Rayleigh wave between surfaces:

$T(x,t)=\text{Constant}\cdot\cos(\pi x/\Lambda)\cdot\cos(2\pi x/\lambda-2\pi f\cdot t)$ and $B(x,t)=\text{Constant}\cdot\sin(\pi x/\Lambda)\cdot\sin(2\pi x/\lambda-2\pi f\cdot t)$.

It is important to note that, in half a beat wavelength, $\Lambda/2$, a Rayleigh wave on one surface is completely transferred to the other surface. The time averaged power transfer between Rayleigh waves on the two surfaces is schematically represented by the inclined arrows and is proportional to $\sin(2\pi x/\Lambda)$, where a positive algebraic sign signifies power transfer from top to bottom and a negative sign signifies power transfer in the other direction. Where either the top or bottom amplitude is small, the power transfer is also small.

The phenomenon of top-bottom oscillation is conventionally regarded as a problem to avoid in acoustic touch sensor design so as to maintain propagating surface acoustic waves on a respective surface. And for this purpose, the touch substrate is designed as a rule to be at least 3 or 4 Rayleigh wavelengths thick to essentially eliminate top-bottom oscillations (although there may be other ways like the use of substrate coatings to suppress the oscillations). A substrate of 3.5 Rayleigh wavelengths is generally sufficient to suppress top-bottom oscillations and a substrate thickness of 5.5 Rayleigh wavelengths is sufficient to confidently eliminate top-bottom oscillations for all plausible engineering situations.

The key engineering parameters to consider are the transmitting frequency, the distance across the substrate (i.e., the top-bottom oscillation distance) required for a top surface acoustic wave to convert into a bottom surface acoustic wave (and vice versa), the thickness of the substrate, and the acoustic path lengths of the touch sensor. The composition of the substrate is also a factor. Generally, though, the thinner the substrate, the shorter the distance for this top-to-bottom energy transfer. If the top-bottom oscillation distance is then comparable or short compared to the acoustic path lengths, then the surface wave energy will not be maintained on the top surface. Consequently, the surface acoustic wave launched on one surface of the substrate will appear on the other surface.

The surface acoustic wave energy that is propagating across the touch region surface transfers between the top and bottom surfaces thus changing the fraction of surface acoustic wave energy at the touch region surface. This results in a modulation of touch sensitivity along the acoustic path across the touch region surface. It would be advantageous to utilize this process to acquire additional and clear coordinate information of multiple simultaneous touches for acoustic touch sensors.

FIGS. 3a-3c are illustrations of touch zones created by top-bottom oscillation in an appropriately constructed substrate 50 for an acoustic touch sensor. FIG. 3a shows a first wedge transmit transducer 52 continuously excited at a first frequency to produce a first surface acoustic wave that propagates in the direction of the arrow and that transitions from the bottom surface to the top surface at a quarter of a beat wavelength from the transducer 52 (note that FIG. 3c shows that the transducer separation (in FIGS. 3a-3c) is one beat wavelength $\Lambda$). A first wedge receive transducer 53 is located at the opposite end of the substrate 50 to receive the wave. A touch at the top surface location marked A only weakly perturbs (in this case, attenuates) the wave which is traveling mainly on the bottom surface. A touch at the top surface location marked B fully attenuates the wave which is now traveling on the top surface. A touch at the top surface location marked C produces an intermediate attenuation as the wave power is more equally split between the top surface and the bottom surface.

Figure 4:
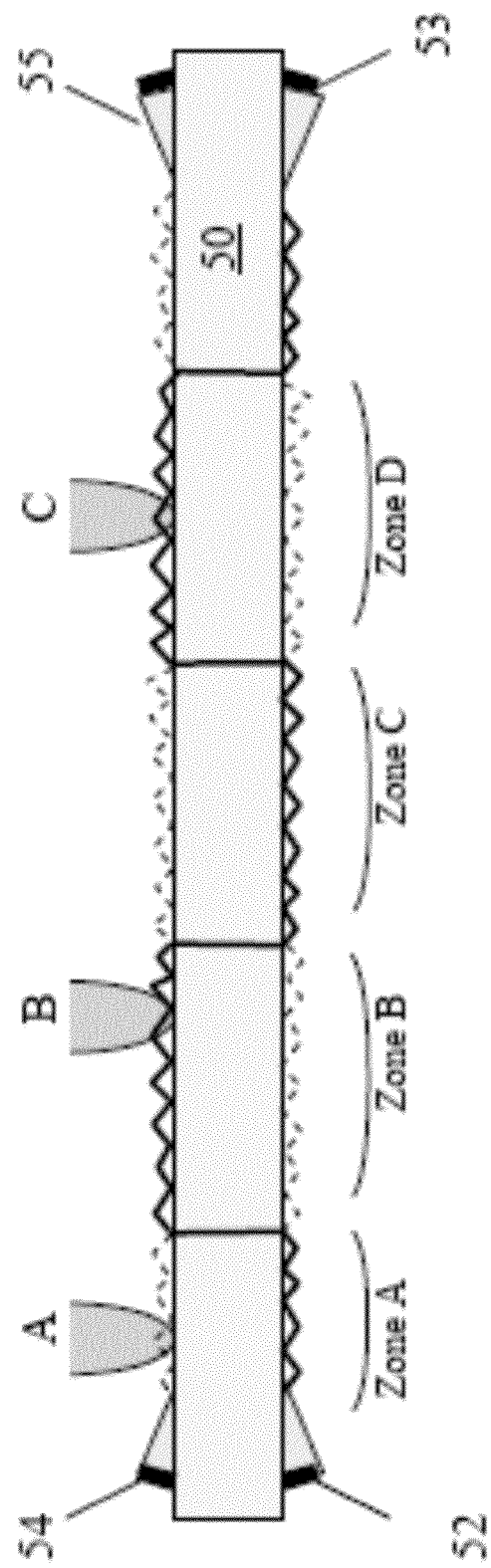
FIG. 4 is another illustration of touch zones created by top-bottom oscillation.

FIG. 3b shows the same figure as FIG. 3a, except the top-bottom wave is illustrated more schematically by a solid, uniformly wavy line. Depending on whether more than 50% of the wave power is concentrated at the bottom surface or the top surface, the wave is schematically draw as entirely being at either the bottom or top surface. As with other fields such as electronics, this schematic notation allows clearer visual representation of design concepts drawings by removing the clutter of too much realism. Nevertheless, the reader should keep in mind that the schematic notation of FIGS. 3b and 3c and FIG. 4 imply no change to the nature of the top-bottom SAW oscillations phenomenon most realistically illustrated in FIG. 2. While the transition from bottom SAW to top SAW is not instantaneous, there are well defined transition points at which there is a flip between which of the top and bottom surfaces have the largest faction of wave power. From this perspective, the wave is describing zones of higher perturbation or attenuation (Touch B) and lower (or no) perturbation or attenuation (Touches A and C). Conceptually, the zone containing a touch can be determined from whether the perturbation or attenuation is higher or lower. In practice, it is more complicated as the strength of the touch is not always known a priori, leading to ambiguity between a light touch in a higher attenuation zone or a heavier touch in a lower attenuation zone. Such ambiguities can be solved with a second surface acoustic wave as shown in FIG. 3c (which would have become rather difficult to read without the aid of the schematic notation).

FIG. 3c shows the same figure and perspective as FIG. 3b, with the addition of a second wedge transmit transducer 54 on the top surface opposite the first wedge transmit transducer 52 and a second wedge receive transducer 55 on the top surface opposite the first wedge receive transducer 53. The second wedge transducer 54 is continuously excited to produce a second surface acoustic wave (indicated by a dashed, uniformly wavy line) that propagates in the direction of the arrow and that transitions for the first time after propagating a quarter of a beat wavelength from the top surface to the bottom surface based on the same beat wavelength Λ of FIG. 3b corresponding to the first frequency. This second wave describes zones of higher attenuation (Touches A and C) and lower (or no) attenuation (Touch B) that are opposite to those created by the first wave. By sending waves from both sides of the substrate 50, the ambiguity referred to above may be resolved by determining which wave is most attenuated. An on/off pattern is consequently formed. Note that the although the figures illustrate the formation of an on/off pattern for one axis of the touch region (in this case, the top surface) of the substrate, a similar on/off pattern may also be simultaneously formed for the other axis of the touch region of the substrate. Note also that FIGS. 3a-3c illustrate the three zones A, B, C to cover approximately 25%, 50% and 25% of the substrate 50 length, respectively.

The on/off pattern defines probable zones of touch or contact that can be used to recognize multiple simultaneous touch points. They are particularly useful in detecting closely-located multiple touch location candidates, one of which is true and the others being ghosts discussed in FIG. 1b, that normally present difficulties for acoustic touch sensors. This is explained with reference to FIG. 4 which is another illustration of touch zones created by top-bottom oscillation. For example, the on/off pattern may be used to distinguish between Touch A and Touch B which are located close together on the touch region but belong to touch zones created by different originating waves (Zones A and B, respectively). The on/off pattern is not useful by itself to distinguish between touches that are distant from one another on the touch region but which are in different touch zones from the same wave, like Touch B and Touch C (which are in Zones B and D, respectively). However, this ambiguity may be resolved using the second detecting axis of the touch region. Note that FIG. 4, similar to FIGS. 3a-3c, illustrates Zone A to cover approximately a quarter-beat wavelength and Zones B, C, and D to each cover a half-beat wavelength.

Advantageously, the present invention provides an acoustic touch sensor that arranges an on/off pattern to create a sensitivity grid across the touch region of the sensor substrate. In this way, touch sensitivity may be varied along the acoustic path along the touch region and additional coordinate information may be acquired to enable real touch points and "ghost touch points" to be distinguished from one another.

Figure 5:
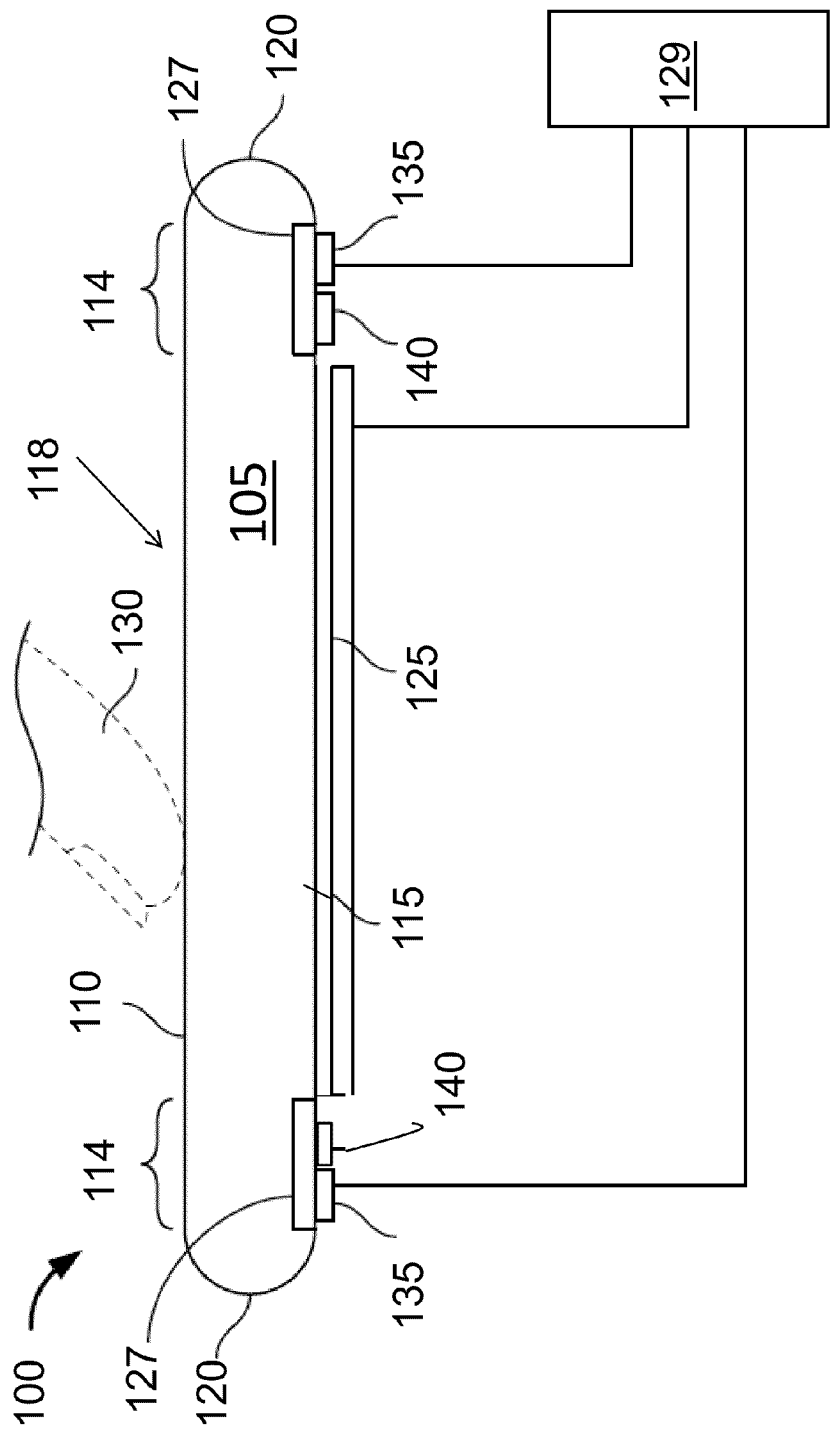
FIG. 5 is a side perspective of an acoustic touch sensor constructed in accordance with the present invention.

FIG. 5 is a side perspective of an acoustic touch sensor 100 constructed in accordance with the present invention. The touch sensor 100 comprises a substrate 105 with a front surface 110, a back surface 115, and connecting end surfaces 120 joining the peripheral regions 114 of the front surface 110 and of the back surface 115. A connecting end surface 120 need not be curved as shown but may be any shape that facilitates the propagation of surface acoustic waves between the front surface 110 and the back surface 115. The substrate 105 is typically made of some form of glass or other material that is configured to permit the propagation of surface acoustic waves upon the peripheral regions 114 and the connecting end surfaces 120 and, on the non-peripheral regions (e.g., the touch region 118 of the front surface 110), to facilitate surface acoustic waves propagating on one surface to transfer, through the substrate 105, to the other surface. The substrate 105 overlies a computer display or computing device display 125, like a liquid crystal display (LCD), an OLED display, a plasma display, a cathode ray tube (CRT), etc. In a bezeled surface acoustic wave touch sensor, the peripheral region of the front surface is covered by a bezel provided by the housing of the touch sensor or the device integrating the sensor, since the operative elements, i.e., the transducers and reflective arrays, are on the front surface of the substrate. In a zero-bezel or bezel-less surface acoustic wave touch sensor 100, which is shown in the figure, the peripheral region 114 of the front surface 110 is merely the outer/peripheral portion of the front surface 110. Bezel-less surface acoustic wave touch sensors are described in more detail in commonly-owned U.S. Published Application 2011/0234545, entitled "Bezel-Less Acoustic Touch Apparatus", which is herein incorporated by reference. Object 130 is seen as a finger, but it is recognized that touches of the touch region 118 sensed by the surface acoustic waves may include a stylus pressing against the front surface 110 directly or indirectly, through a cover sheet or an anti-glare coating, depending upon the application of the touch sensor 100. Acoustic transducers 135 and reflective element arrays 140 (both shown in this figure only for illustrative purposes and described in more detail below) are provided on a border layer 127 of opaque paint or ink in the peripheral region 114 of the back surface 115. Optionally, as will be described later, the nature of the border layer 127 may be such as to suppress oscillation of surface acoustic waves between surfaces. Oscillation of surface acoustic waves between surfaces in the region of the reflective element arrays 140 may also be suppressed via local thickening (not shown in FIG. 5) of the substrate 105. The transducers 135 are operably coupled to a controller or control system 129 (which may be part of a system processor in some embodiments) that is also operably coupled to the display 125. The controller or control system 129 drives the operation of the transducers 135 and measures the signals from such transducers to determine the touch coordinates, which are then provided to an operating system and software applications to provide the required user interface with the display 125.

Figure 6:
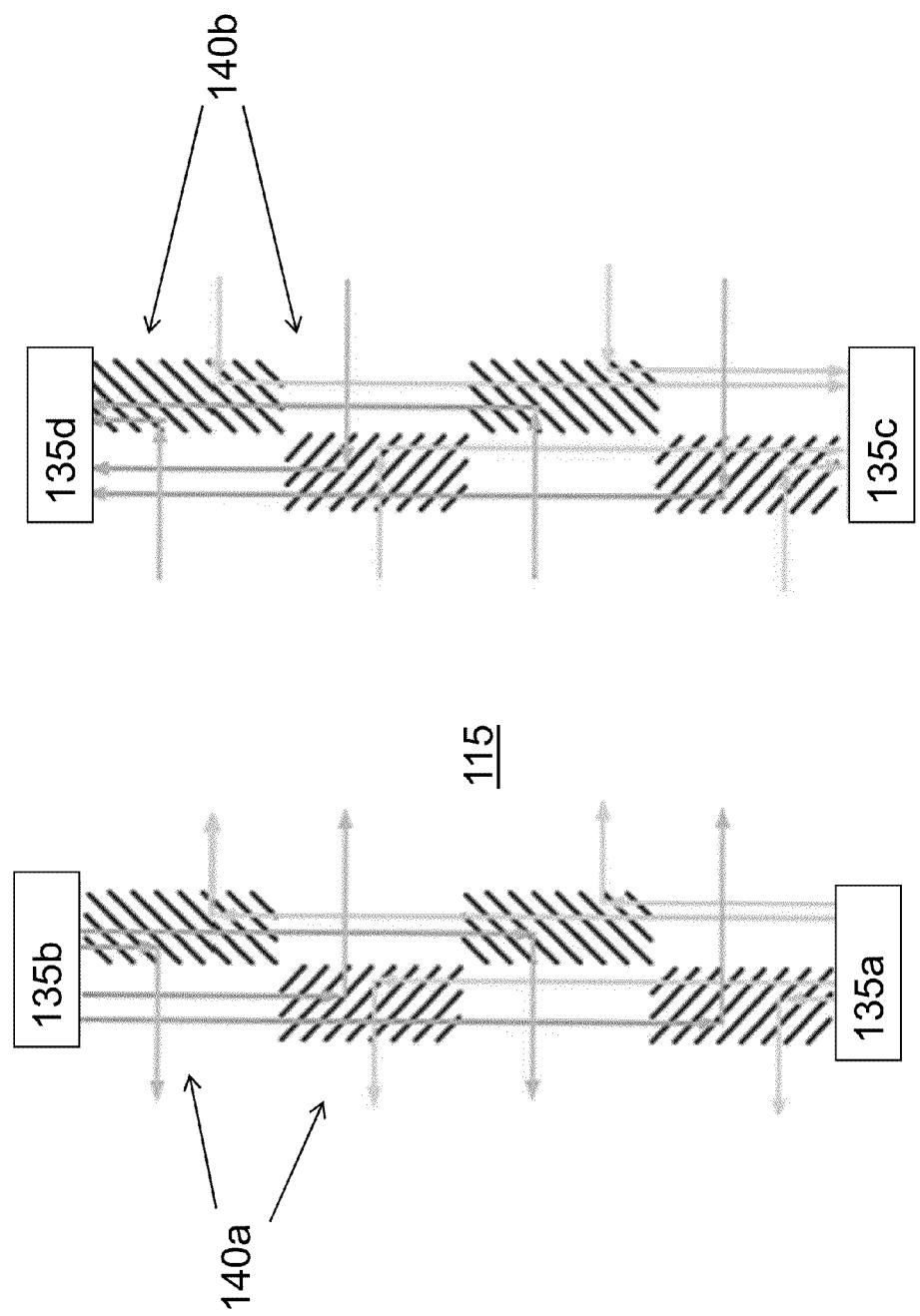
FIG. 6 is an illustration of a transducer-reflector array arrangement for the sensor of FIG. 5.

FIG. 6 is an illustration of a transducer-reflector array arrangement for providing surface acoustic waves for a respective axis of the touch region 118 of the touch sensor 100. On one side of the back surface 115 on the periphery region 114, a first segmented reflector array 140a is disposed between a first transmitting transducer 135a and a second transmitting transducer 135b. The segments of the first segmented array 140a are disposed in zigzag fashion between the two transducers 135a, 135b. Also, each segment is configured to have its reflector elements facing in the opposite direction from the respective reflector elements of the preceding and the succeeding segment. The result is alternating-facing segments, i.e., a group of segments with elements of a first orientation and a group of segments with elements of a second orientation. The transducers 135a, 135b are adapted to generate surface acoustic wave pulses that propagate across the peripheral region 114 surface along which the first array 140a is disposed (represented by respective arrows in the figure). On the opposing side of the back surface 115, a second segmented reflector array 140b is disposed between a first receiving transducer 135c and a second receiving transducer 135d. The segments of the second segmented array 140b are disposed in zigzag fashion between the two transducers 135c, 135d. Also, each segment is configured to have its reflector elements facing in the opposite direction from the respective reflector elements of the preceding and the succeeding segment. The result is alternating-facing segments, i.e., a group of segments with elements of a first orientation and a group of segments with elements of a second orientation. The transducers 135c, 135d are adapted to receive surface acoustic wave pulses that are reflected and propagate across the peripheral region 114 surface along which the second array 140b is disposed (represented by respective arrows in the figure).

As can be further seen by the arrows in the figure, the combination of two facing transducers and a respective reflector array being segmented with alternating-facing reflector elements operates to reflect (or receive) surface acoustic waves in two directions along a respective axis of the back surface 115 (and subsequently the touch region 118 on the front surface 110). More specifically, the surface acoustic waves of the first transmitting traducer 135a are reflected towards the center of the back surface 115 by a group of segments with elements of a first orientation and away from the center by a group of segments with elements of a second orientation. The surface acoustic waves of the opposite-facing second transmitting traducer 135b are reflected in opposite fashion by the same two groups of segments. Similarly, the first receiving transducer 135c receives surface acoustic waves from the center of the back surface 115 by a group of segments with elements of a first orientation and from the edge of the back surface 115 (i.e., from a connecting end surface 120 not shown in the figure) by a group of segments with elements of a second orientation. The opposite-facing second receiving traducer 135d receives surface acoustic waves in opposite fashion by the same two groups of segments.

Figure 7A:
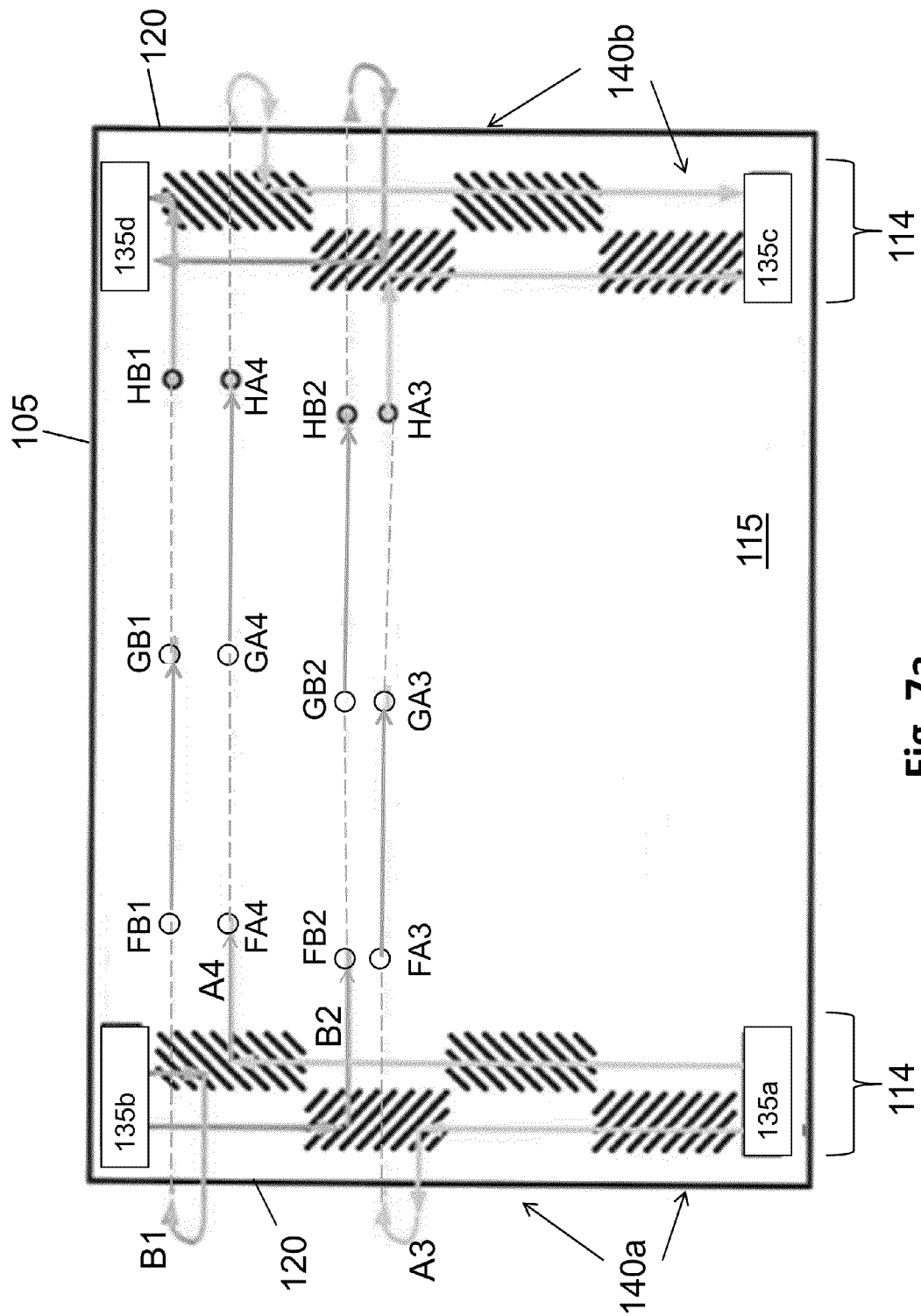
FIG. 7a is a simplified plan view of the substrate back surface of the sensor of FIG. 5.

FIG. 7a is a simplified plan view of the back surface 115 that illustrates the creation of a sensitivity grid across the touch region 118 (not shown) and the operation of the touch sensor 100. For ease of visualization and description, the figure only shows the transducer-reflector array arrangement described above for detecting touches along the Y-axis of the touch region 118. It is understood that the back surface 115 has a second transducer-reflector array arrangement disposed thereon for detecting touches along the X-axis of the touch region 118 in a similar fashion as the illustrated Y-axis arrangement. The second X-axis arrangement is disposed at right angles to the first Y-axis arrangement at the other two sides along the periphery region 114 of the back surface 115 to define a two-dimensional coordinate system.

As noted above, on one side of the back surface 115 on the periphery region 114, the first segmented reflector array 140a is disposed between the first transmitting transducer 135a and the second transmitting transducer 135b. On the opposing side of the back surface 115, the second segmented reflector array 140b is disposed between the first receiving transducer 135c and the second receiving transducer 135d. Also, the substrate 105 is configured to permit the propagation of surface acoustic waves upon the peripheral regions 114 and the connecting end surfaces 120 and, on the non-peripheral regions (e.g., the touch region 118 of the front surface 110), to facilitate surface acoustic waves propagating on one surface to transfer, through the substrate 105, to the other surface. As noted in FIG. 5, the touch sensor 100 is operatively connected with a control system 129 for the associated computer or computing device that integrates the sensor 100. The control system 129 generates an electronic signal that excites the transmitting transducers 135a, 135b to generate respective surface acoustic waves (or wave pulses). The control system 129 also receives respective electrical signals transduced by the receiving transducers 135c, 135d from the received surface acoustic waves. The control system 129, as used herein, means electronics typically including a microprocessor with firmware and analog electronics to generate excitation signals and to receive back and analyze signals from the touch sensor 100. Typically, the control system 129 may generate a tone burst of N cycles and hence of duration $\Delta t=N/f$, where f is the nominal frequency of the tone burst. As with conventional SAW touchscreens, it is desirable that N be sufficiently small so that the burst duration $\Delta t$ be sufficiently small to provide an attenuation or perturbation of the received signal due to a touch with a sufficiently well defined delay time to provide the conventional time-delay-based coordinate with good resolution. On the other hand, a tone burst of N cycles of nominal frequency f will have a finite bandwidth proportional to $\Delta f=f/N$ and it is desirable that N be sufficiently large so that $\Delta f$ is sufficiently small to provide a well defined oscillation beat wavelength $\Lambda$ to provide a coordinate resolved by top-bottom SAW oscillation with good resolution. As will be discussed below, the control system 129 therefore may be required to employ additional signal processing techniques to handle the received signals in those conditions when the number of burst cycles N cannot be simultaneously sufficiently small for $\Delta t$ to be in a desired range and sufficiently large for $\Delta f$ to be in a desired range.

In operation, the first transmitting transducer 135a generates surface acoustic waves that travel along the positive (+) Y-axis direction of the peripheral region 114 of the back surface 115 on which the first segmented reflective array 140a is situated. The elements of all the segments of the array 140a each transmit part of the surface acoustic waves to an adjacent element of the array 140a. Also, the elements of the first and third segments are oriented so each segment couples or reflects part of the surface acoustic waves (labeled as wave path A3 for the third segment) to travel from the first array 140a outwardly along the negative (−) X-axis direction toward and around the proximate curved connecting surface 120; and b) along the positive (+) X-axis direction across the front surface 110 (not shown) toward the opposing connecting surface 120. Also, the elements of the second and fourth segments are oriented so each segment couples or reflects part of the surface acoustic waves (labeled as wave path A4 for the fourth segment) to travel from the first array 140a inwardly along the positive (+) X-axis direction across the center of the back surface 115 toward the second segmented reflector array 140b. For ease of visualization and description, the figure only shows solid lined arrows indicating the respective wave propagation paths on the back surface 115 using the third and fourth segments and dotted lines indicating the respective wave propagation paths on the front surface 110 (not shown) using the third and fourth segments.

Similarly, the second transmitting transducer 135b generates surface acoustic waves that travel along the negative (−) Y-axis direction of the peripheral region 114 on which the first segmented reflective array 140a is situated. The elements of all the segments of the array 140a each transmit part of the surface acoustic waves to an adjacent element of the array 140a. Also, the elements of the second and fourth segments (seen from the bottom of the figure) are oriented so each segment couples or reflects part of the surface acoustic waves (labeled as wave path B1 for the fourth segment) to travel from the first array 140a outwardly along the negative (−) X-axis direction toward and around the proximate curved connecting surface 120; and b) along the positive (+) X-axis direction across the front surface 110 (not shown) toward the opposing connecting surface 120. Also, the elements of the first and third segments (seen from the bottom of the figure) are oriented so each segment couples or reflects part of the surface acoustic waves (labeled as wave path B2 for the third segment) to travel from the first array 140a inwardly along the positive (+) X-axis direction across the center of the back surface 115 toward the second segmented reflector array 140b. For ease of visualization and description, the figure only shows solid lines arrow indicating the respective wave propagation paths using the third and fourth segments.

As the surface acoustic waves of both transducers 135a, 135b travel across the front surface 110, the configuration and composition of the substrate 105 permits the surface acoustic waves (on wave paths A3 and B1, respectively) to travel to the back surface 115 via the energy transfer caused by the action of the Lamb wave modes $S_0$ and $A_0$. The respective transfer points FA3 and FB1, where the majority of power switches between surfaces, are represented as small circles in the figure. The substrate 105 then maintains the majority wave power propagation paths A3, B1 on the back surface 115 for a distance before the majority of wave power travels back to the front surface 110 at the respective transfer points GA3 and GB1. The substrate 105 maintains the majority wave power propagation paths A3, B1 on the front surface 105 for a distance before the majority of wave power transfers again to the back surface 115 at the respective transfer points HA3 and HB1. The substrate 105 then maintains the majority wave power propagation paths A3, B1 on the back surface 115 long enough for the waves reach the peripheral region 114 of the back surface 115 and to a respective segment of the second segmented reflector array 140b. The elements of the segments each transmit the received surface acoustic waves to an adjacent element of the second array 140b so that the waves continue traveling along the second array 140b a) along the negative (−) Y-axis direction to the first receiving transducer 135c for the waves from the first transmitting transducer 135a on the wave path A3, and b) along the positive (+) Y-axis direction to the second receiving transducer 135d for the waves from the second transmitting transducer 135b on the wave path B1.

Similarly, as the surface acoustic waves of both transducers 135a, 135b travel across the back surface 115, the configuration and composition of the substrate 105 permits the surface acoustic waves (on wave paths A4, B2, respectively) to travel to the front surface 110 via the energy transfer caused by the action of the Lamb wave modes $S_0$ and $A_0$. The respective transfer points FA4 and FB2, where the majority of power switches between surfaces, are represented as small circles in the figure. The substrate 105 then maintains the majority wave power propagation paths A4, B2 on the front surface 110 for a distance before the majority of wave power travels back to the back surface 115 at the respective transfer points GA4 and GB2. The substrate 105 maintains the majority wave power propagation paths A4, B2 on the back surface 115 for a distance before the majority of wave power transfers again to the front surface 110 at the respective transfer points HA4 and HB2. The substrate 105 then maintains the majority of wave power propagation paths A4, B2 on the front surface 110 and around the proximate curved connecting surface 120 so the waves reach the peripheral region 114 of the back surface 115 and a respective segment of the second segmented reflector array 140b. The elements of the segments each transmit the received surface acoustic waves to an adjacent element of the second array 140b so that the waves continue traveling along the second array 140b a) along the negative (−) Y-axis direction to the first receiving transducer 135c for the waves from the first transmitting transducer 135a on the wave path A4, and b) along the positive (+) Y-axis direction to the second receiving transducer 135d for the waves from the second transmitting transducer 135b on the wave path B2.

Figure 7B:
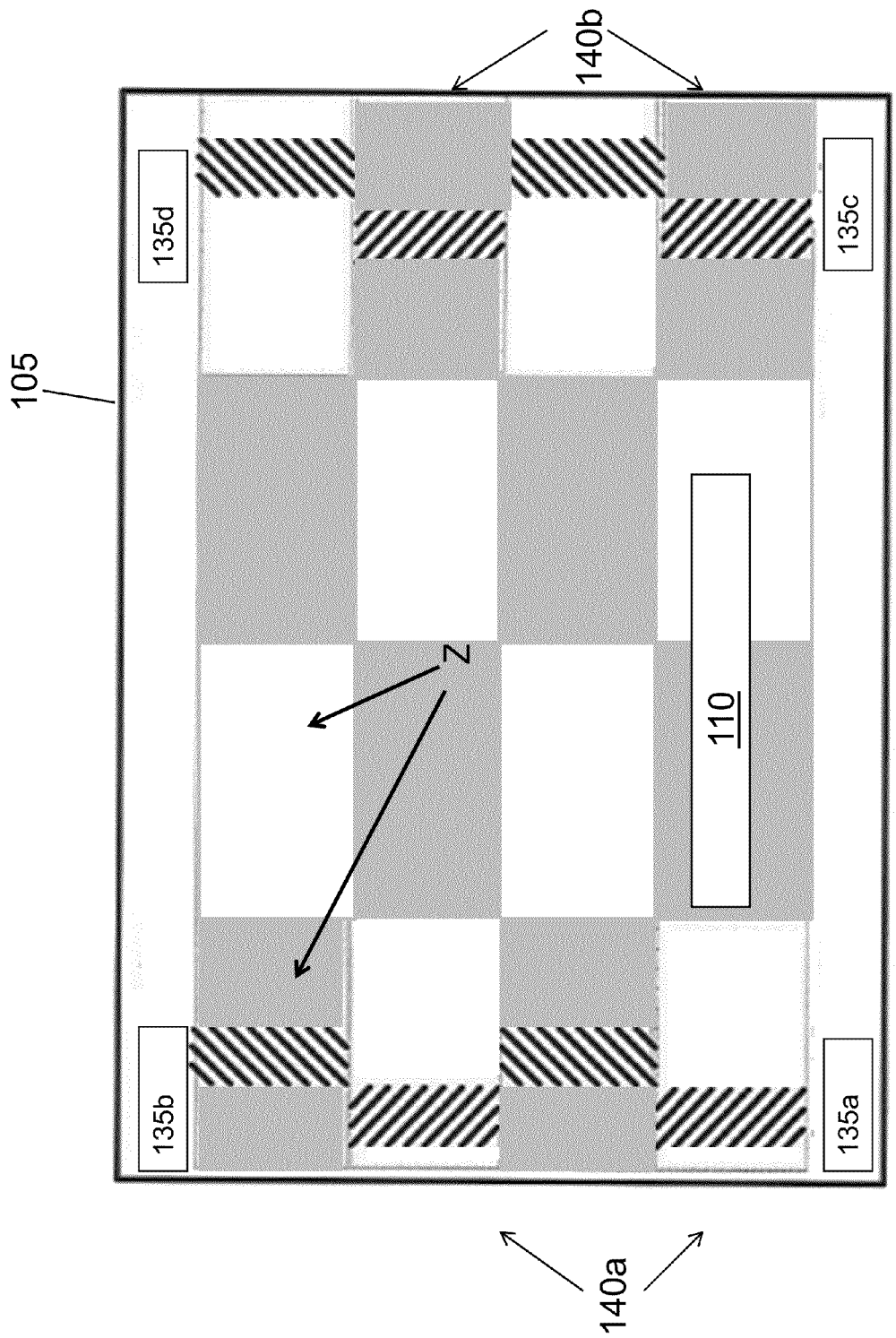
FIG. 7b is an illustration of a back view of the front surface of the substrate of FIG. 7a having an idealized sensitivity grid formed thereon.

Exciting the first transmitting transducer 135a and the second transmitting transducer 135b sequentially results in a grid or checkerboard pattern of high and low touch sensitivity zones Z as the energy of the surface acoustic waves alternate between the back surface and the front surface 110 and the surface acoustic waves of each of the transmitting transducers 135a, 135b alternate being on a respective surface and respective zone. FIG. 7b illustrates a back view through the substrate 105 of the front surface 110 (and touch region 118) of the plan view of FIG. 7a and an idealized pattern formed thereon. This is an opposite pattern of high and low sensitivity zones that is formed on the back surface 115. It is noted that the substrate 105 and the segmented arrays 140a, 140b may be adapted as desired to form a grid pattern having a number of columns and/or rows of zones different than that illustrated and described above. It is also noted that, although the sensor 100 design enables the entire front surface 110 to be acoustically active, the top-bottom energy transitions may be avoided at the respective locations of the arrays 140a, 140b (and the corresponding respective locations on the front surface 110) even though the arrays 140a, 140b are within the boundaries of a particular sensitivity zone. Methods for avoiding top-bottom energy transitions include use of an oscillation disrupting coating and thickening of the substrate in the region of the arrays; this will be described in more detail below.

Figure 7C:
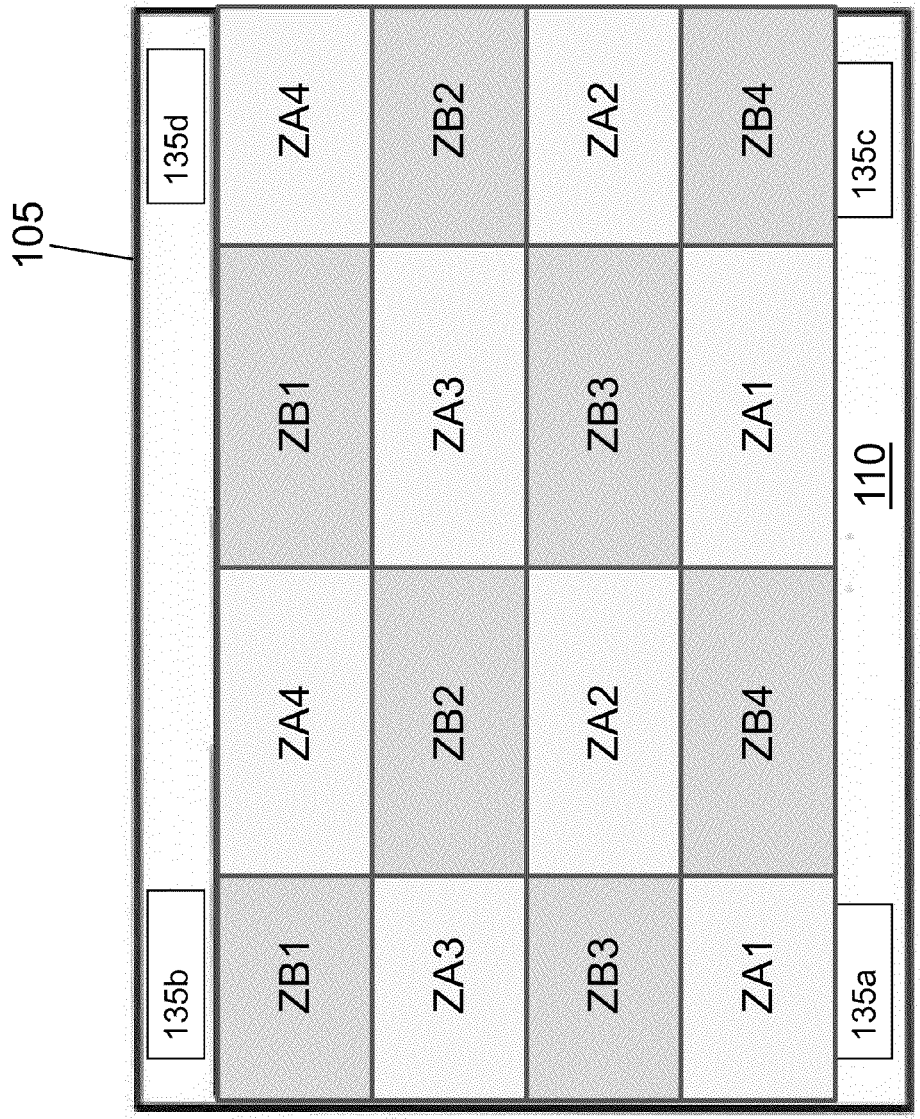
FIG. 7c is another illustration of the back view of the front surface of the substrate of FIG. 7a having an idealized sensitivity grid formed thereon.

FIG. 7c is a second illustration of the back view through the substrate 105 of the front surface 110 of the plan view of FIG. 7a and the idealized pattern formed thereon. In this figure, the zones are labeled to identify the alternating surface acoustic waves generated by each of the transmitting transducers 135a, 135b (which run through a grid row, e.g., zone ZB1 in the first row). It is understood that a similar sensitivity grid is also formed for the X-axis coordinate direction. In the X-axis grid, the alternating surface acoustic waves generated by each of the respective transmitting transducers run through a grid column.

As in the case of a standard touch sensor, a touch of the touch region 118 in any particular zone absorbs a portion of the energy of the surface acoustic waves propagating across the front surface 110 and causes a perturbation, such as an attenuation, of the waves passing through the point of touch. The resulting attenuation is detected by the respective receiving transducer for each axis direction as a perturbation in the acoustic signal. However, as noted above, the alternating or on/off pattern defines probable zones of touch or contact that can be used to recognize multiple simultaneous touch points. For example, a single touch of the upper left zone labeled ZB1 in the first row of the sensitivity grid is identified by the second receiving transducer 135d as a probable touch of that specific Y-axis location and of every other Y-axis location along the first row that includes a zone labeled ZB1. To distinguish between zone locations, the sensor 100 uses the X-axis sensitivity grid which simultaneously identifies the touch as a probable touch of that specific X-axis location since there will be, in similar fashion, more than one same-labeled zone along the first column. The sensor 100 detects the coincidence of the Y-axis and X-axis probabilities for that specific location to localize the touch coordinates (in this example, at the upper left corner). In the same way, the sensor 100 distinguishes between multiple touches that are distant from one another on the touch region 118 but which are in different touch zone locations created by the same originating surface acoustic wave. The sensitivity grid is particularly useful in detecting closely-located multiple touches, for example, touches which are located close together on the touch region 118 but belong to touch zones created by different originating waves (e.g., the two upper left corner zones labeled ZB1 and ZA4).

The control system 129 processes and analyzes all of the electrical signals transduced by the receiving transducers, including those related to waveform perturbations, to detect the touch coordinates and position information in a manner similar to that described above. Further, the control system 129 maps the touch coordinates and position information to the appropriate control actions of the user interface shown in the display 125 that is generally placed behind the back surface 115.

To assist in resolving the touch probabilities (so-called ambiguities) and thus localizing the touch coordinates, the sensor 100 may use additional information provided by the alternating top-bottom energy transitions. For ease of visualization and description, FIGS. 7a-7c represent the top-bottom transitions as discrete events and the sensitivity grids as a binary system (i.e., a wave transition is considered complete and instantaneous). As noted above, however, the top-bottom transitions are actually continuous processes. FIGS. 8a-8c are illustrations of touch zones created by top-bottom oscillation (shown as a continuous wave) in an appropriately constructed substrate 150 for an acoustic touch sensor. The figures are similar to those illustrated with respect to FIGS. 3a-3c. FIG. 8a specifically shows a first wedge transducer 152 continuously excited at a first frequency to produce a first surface acoustic wave that propagates in the direction of the arrow and that transitions from the bottom surface to the top surface. A touch at the top surface location marked A does not attenuate the wave which is traveling on the bottom surface. A touch at the top surface location marked B fully attenuates the wave which is now traveling on the top surface. A touch at the top surface location marked C produces an intermediate attenuation (or no attenuation) as the wave is transitioning from the top surface to the bottom surface.

To obtain the checkerboard pattern of the Y-axis sensitivity grid, the sensor 100 excites the first transmitting transducer 135a and the second transmitting transducer 135b sequentially. FIGS. 8b and 8c show respective representations of the two surface acoustic waves generated by the two transducers. Each of FIGS. 8b and 8c show the same figure and perspective as FIG. 8a, with the addition of a second wedge transducer 154 on the top surface opposite the first transducer 152. FIG. 8b shows the two waves in an antiphase spatial relationship and FIG. 8c shows the two waves in an out-of-phase spatial relationship. Depending upon the touch position, the ratio of attenuation between the two waves is different. Multiple touch locations corresponding to different touch zone locations created by the same originating surface acoustic wave zone (i.e., ambiguities) have the same pair of attenuation values. If the touch strength is known by other means (such as from measurements of orthogonal surface acoustic waves) and the two waves are in antiphase relationship as in FIG. 8b, then the ambiguities are not regularly spaced and have the same attenuation power (proportional to the depth of attenuation). If the two waves are out-of-phase, then the ambiguities in the interpretation of a pair of attenuation values for a touch of known strength occur once every top-bottom beat wavelength Λ. As part of processing the electrical signals transduced by the receiving transducers, the sensor 100 can determine both the ratio of attenuation between the two surface acoustic waves generated by the two transmitting transducers and the power of attenuation of each wave. This information can then be weighted with similar information about a respective ambiguity obtained from the X-axis sensitivity grid to create a map of probable touch position that more clearly localizes the touch coordinates. Note that an out-of-phase relationship between the two waves is particularly useful in resolving ambiguities because of the extra information provided concerning the powers of attenuation of the two waves.

Figure 9B:
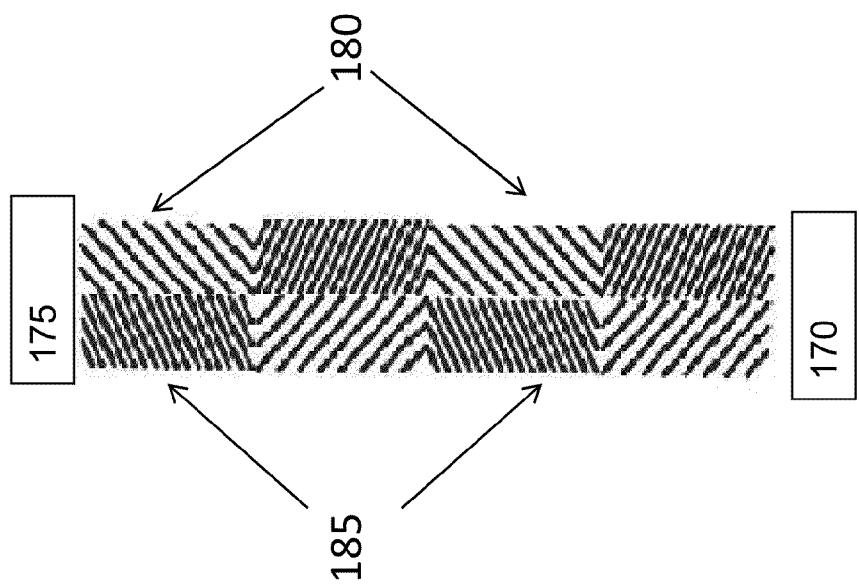
FIG. 9b is an illustration of another segmented array configuration.
Figure 9A:
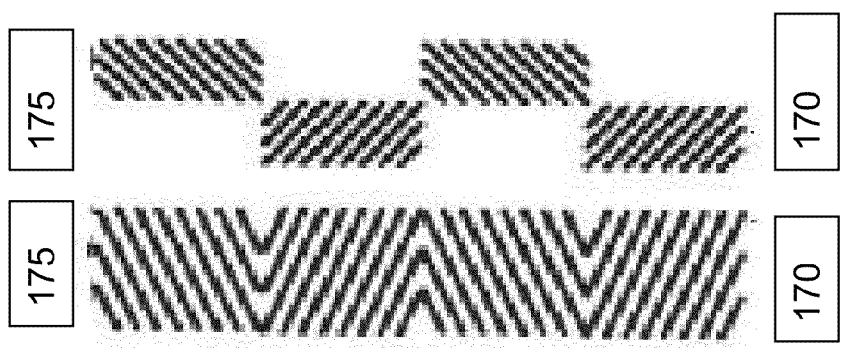
FIG. 9a is an illustration of two segmented array configurations.

The segmented reflector arrays may have different configurations depending upon the application and/or other design considerations. FIG. 9a shows a side-by-side comparison of two segmented array configurations disposed between two respective transducers 170, 175. The array on the right side (also shown in the above figures) has non-overlapping segments. The array on the left side of the figure has overlapping segments. Each array may have different characteristics in terms of noise, parasitic waves, etc. FIG. 9b shows a multiple frequency, segmented array configuration between the two transducers 170, 175. For this configuration, a respective transmitting transducer must be able to generate surface acoustic waves at two or more (N) frequencies, either sequentially or simultaneously and a respective receiving transducer, and associated electronics, must be able to demultiplex the N frequencies to decode the waves separately. The array configuration shown may be viewed as two non-overlapping segmented arrays 180, 185 that are formed in interlocking fashion. The array configuration though may have more than two interlocking arrays. The segments of each array are tuned to one of the N frequencies of the generated waves. With such an array configuration, frequencies may be selected that can implement more than one sensitivity grid pattern on the touch region for obtaining more information about multiple touches to resolve ambiguities.

The segmented reflector arrays may also have different reflector densities depending upon the application and/or other design considerations. In a typical acoustic touch sensor using surface acoustic waves, the reflector array density varies to reflect the same amount of energy everywhere on the touch surface and to provide equalization of the attenuation profiles of the waves. The sensor 100 of the present invention does not provide this typical energy distribution because each array is reflecting waves coming from both directions along its length. The sensor 100 instead may use constant reflector density arrays and a control system 129 that equalizes the wave signals electronically.

Figure 10:
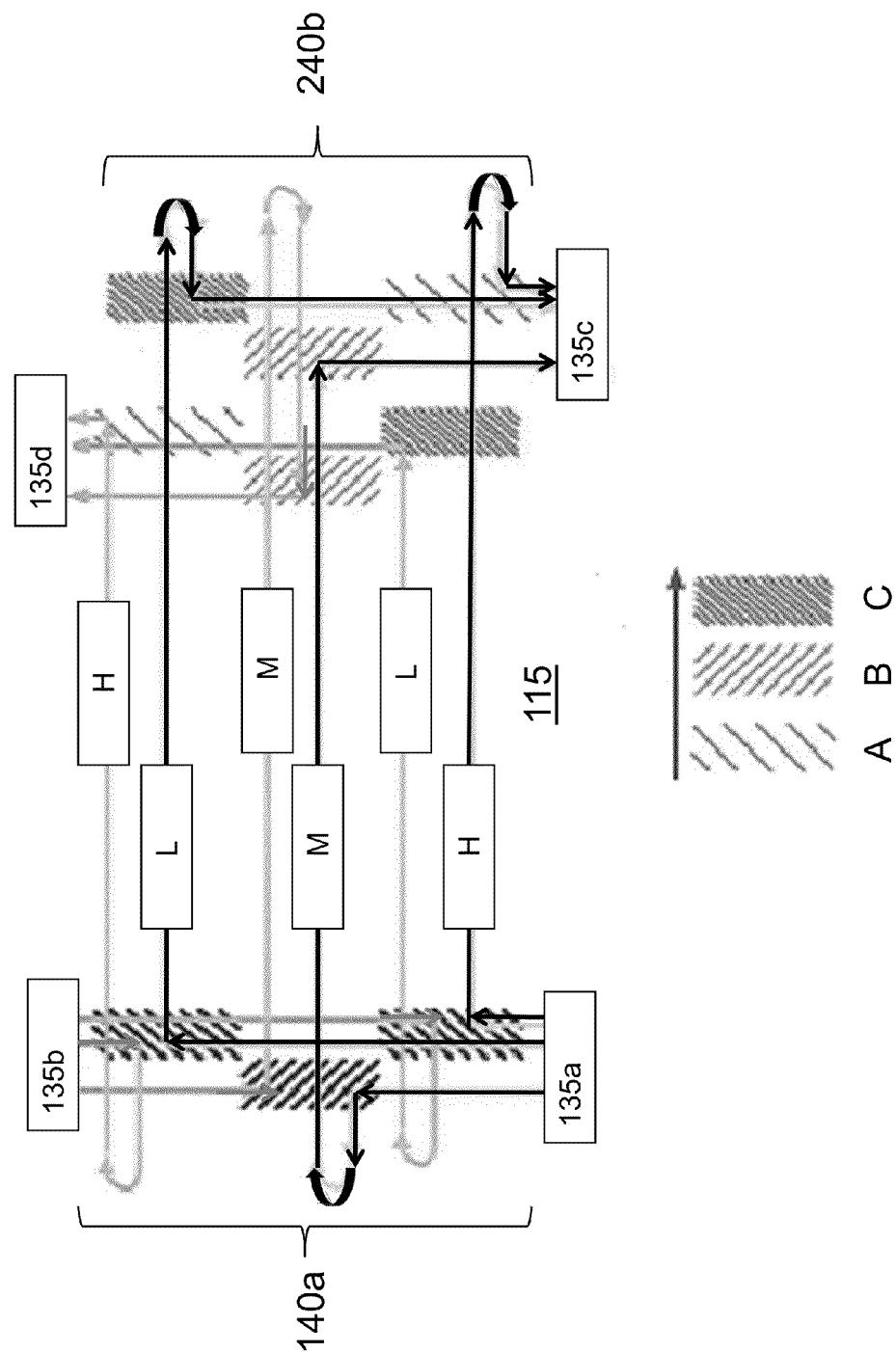
FIG. 10 is a simplified plan view of the back surface of the sensor of FIG. 5 with a varying reflector density array.

Alternatively, the sensor 100 may utilize a constant reflector density array for the transmitting transducers and a varying reflector density array for the receiving transducers that compensate for the difference in energy density of the waves. FIG. 10 is a simplified plan view of the back surface 115 that illustrates the usage of a varying reflector density array 240b for the sensor 100. As noted above, on one side of the back surface 115, the first segmented reflector array 140a is disposed between the first transmitting transducer 135a and the second transmitting transducer 135b, which face one another. The first segmented reflector array 140a comprises a constant reflector density. On the opposing side of the back surface 115, a second segmented reflector array 240b is disposed between the first receiving transducer 135c and the second receiving transducer 135d. The second segmented reflector array 240b comprises varying reflector density. In the figure, the second array 240b has segments A, B, C of three different reflector densities (although a different number may be used). The figure legend of the segments shows a solid line arrow pointing in the direction of increasing reflector density, with segment A having the least density and segment C having the largest density. Note also that the first receiving transducer 135c and the second receiving transducer 135d are not directly facing each other across the back surface 115 but are instead spatially offset.

The transmitting transducers 135a, 135b operate as described above by generating surface acoustic waves that travel in respective directions along the back surface 115 on which the first segmented reflective array 140a is situated. The waves H that couple or reflect from the respective nearest segment of the array 140a have the highest energy and those waves L that couple or reflect from the respective farthest segment have the lowest energy. The waves M that couple or reflect from the middle-located segment have intermediate energy (i.e., relative to the other waves H, L). The second segmented array 240*b* is arranged so that the least reflector dense segment A receives the highest energy waves H, the intermediate reflector dense segment B receives the intermediate waves M, and the most reflector dense segment C receives the lowest energy waves L. As described above, the waves H, M, L generated by the first transmitting transducer 135*a* are then reflected by the segments A, B, C to the first receiving transducer 135*c* and the waves H, M, L generated by the second transmitting transducer 135*b* are then reflected by the segments A, B, C to the second receiving transducer 135*d*. In this way, the energy densities of the waves may be equalized. It is understood that the back surface 115 has a second transducer-reflector array arrangement disposed thereon for the X-axis direction of the touch region in a similar fashion as the illustrated Y-axis arrangement.

Figure 11:
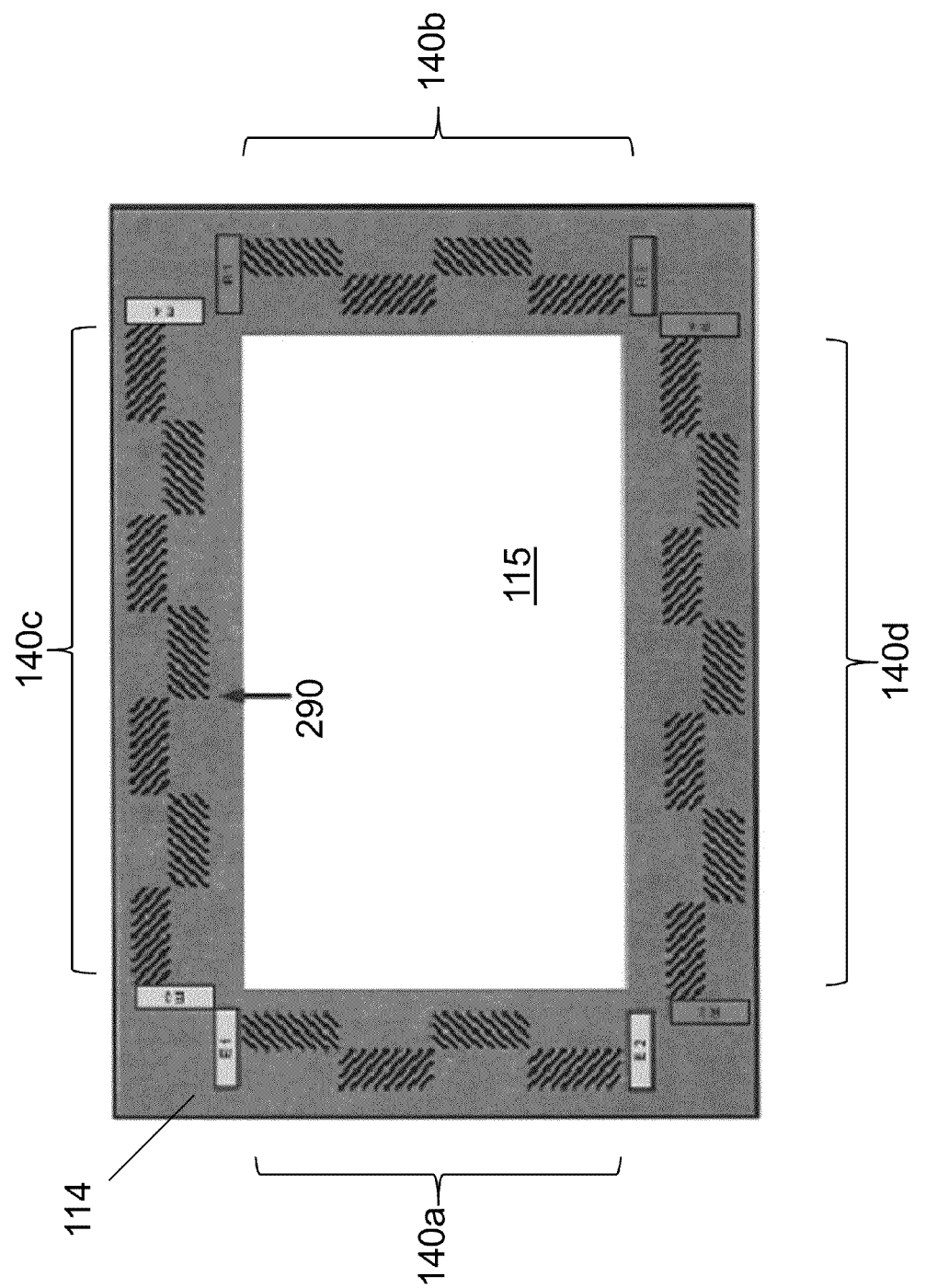
FIG. 11 is a simplified plan view of the back surface of the sensor of FIG. 5 with transducer-reflector array arrangements for both axis directions.

As noted above, the sensor 100 design enables the entire front surface 110 to be acoustically active. However, in the operation of the sensor 100, it is generally desired that the top-bottom energy transition be minimized or eliminated when surface acoustic waves are propagating along the respective locations of the arrays (and the corresponding respective locations on the front surface 110) even though the arrays are within the boundaries of a particular sensitivity zone. There are several approaches to accomplish this and several are described in more detail in the above-referenced and incorporated U.S. patent applications by Hecht, et al and Son, et al. One approach is briefly discussed with respect to FIG. 11 which is a simplified plan view of the back surface 115 of the sensor 100 that shows the transducer-reflector array arrangements of FIGS. 6 and 7 for both axis directions of the touch region of the front surface (not shown). As noted above, for the Y-axis direction, on one side of the back surface 115, the first segmented reflector array 140*a* is disposed between the first transmitting transducer E1 and the second transmitting transducer E2. On the opposing side of the back surface 115, a second segmented reflector array 140*b* is disposed between the first receiving transducer R1 and the second receiving transducer R2. Similarly for the X-axis direction, on one side of the back surface 115, a third segmented reflector array 140*c* is disposed between the third transmitting transducer E3 and the fourth transmitting transducer E4. On the opposing side of the back surface 115, a fourth segmented reflector array 140*d* is disposed between the third receiving transducer R3 and the fourth receiving transducer R4. The transducers and the arrays are disposed in the periphery region 114 of the back surface 115 which may have a border coating 290 applied thereon. With a coating material and thickness chosen to significantly alter the Rayleigh wave phase velocity, the symmetry between top and bottom surface acoustic waves may be broken so there no longer exist coupled identical oscillators or waves. This effectively turns off or reduces top-bottom transitions in the respective locations of the arrays and transducers. An additional or alternate method to suppress top-bottom transitions in the periphery region 114 is to increase the thickness of substrate 105 in the periphery region 114 but not in the desired touch area. This takes advantage of the fact that the top-bottom beat wavelength Λ increases rapidly with increased thickness of the substrate 105 and that top-bottom transitions in the peripheral region 114 are effectively eliminated when the beat wavelength Λ becomes long compared to the dimensions of the substrate 105. Both methods of suppressing top-bottom transitions in the arrays are described in more detail in the above-referenced patent applications of Hecht, et al. and Son, et al.

Figure 12:
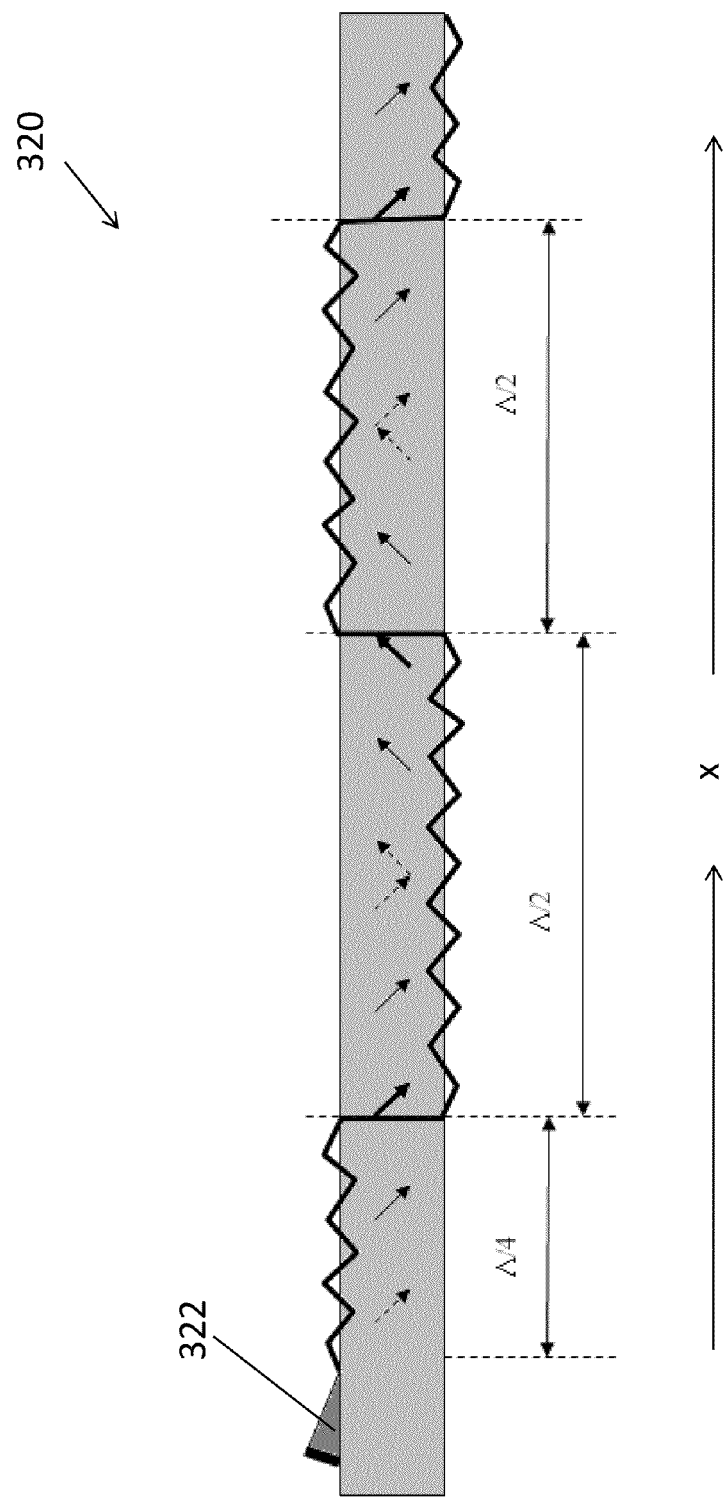
FIG. 12 is a modification of FIG. 2 illustrating top-bottom oscillation phenomenon in a thin substrate.
Figure 13:
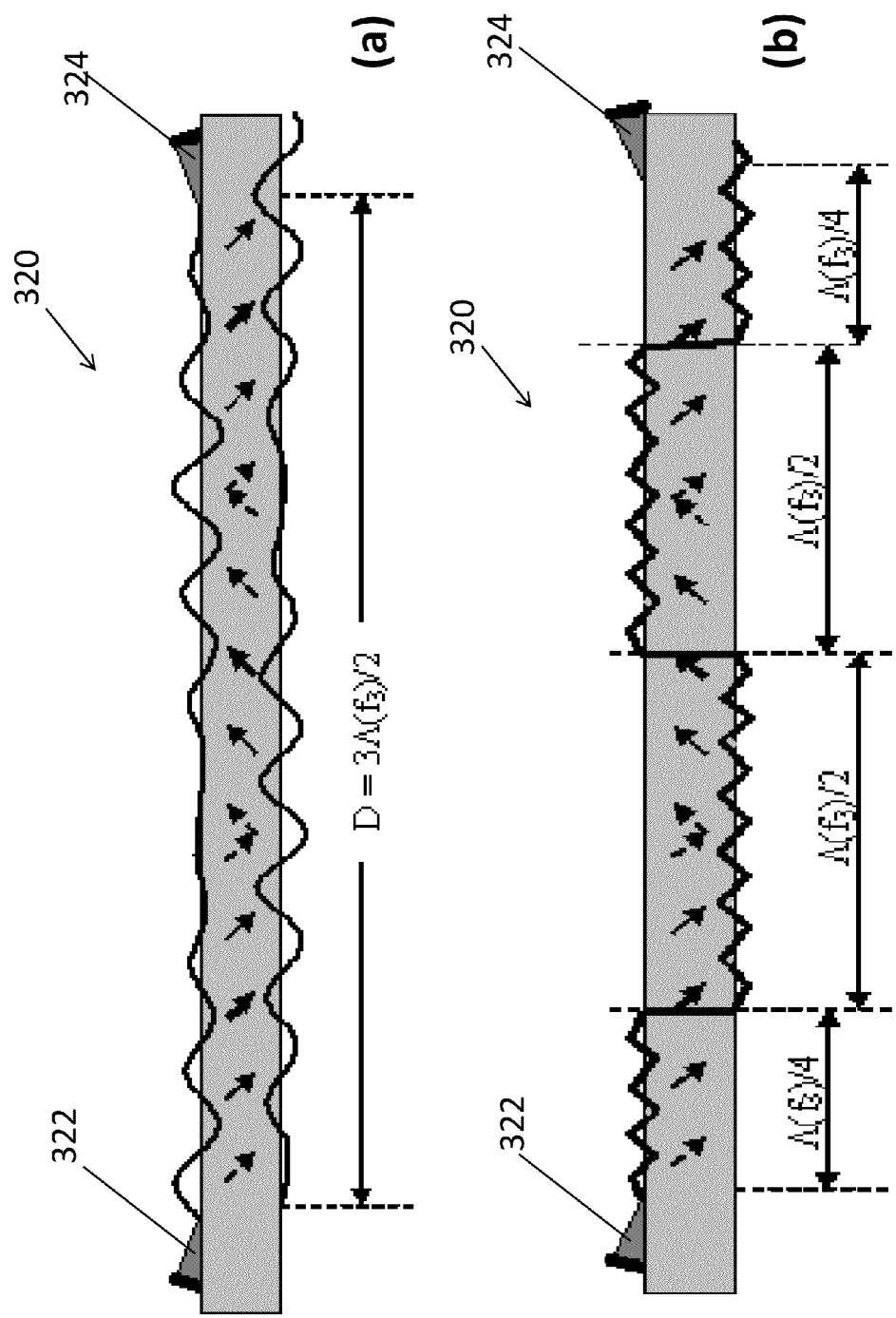
FIGS. 13a and 13b are modifications of FIG. 2 illustrating top-bottom oscillation phenomenon in a thin substrate.
Figure 14:
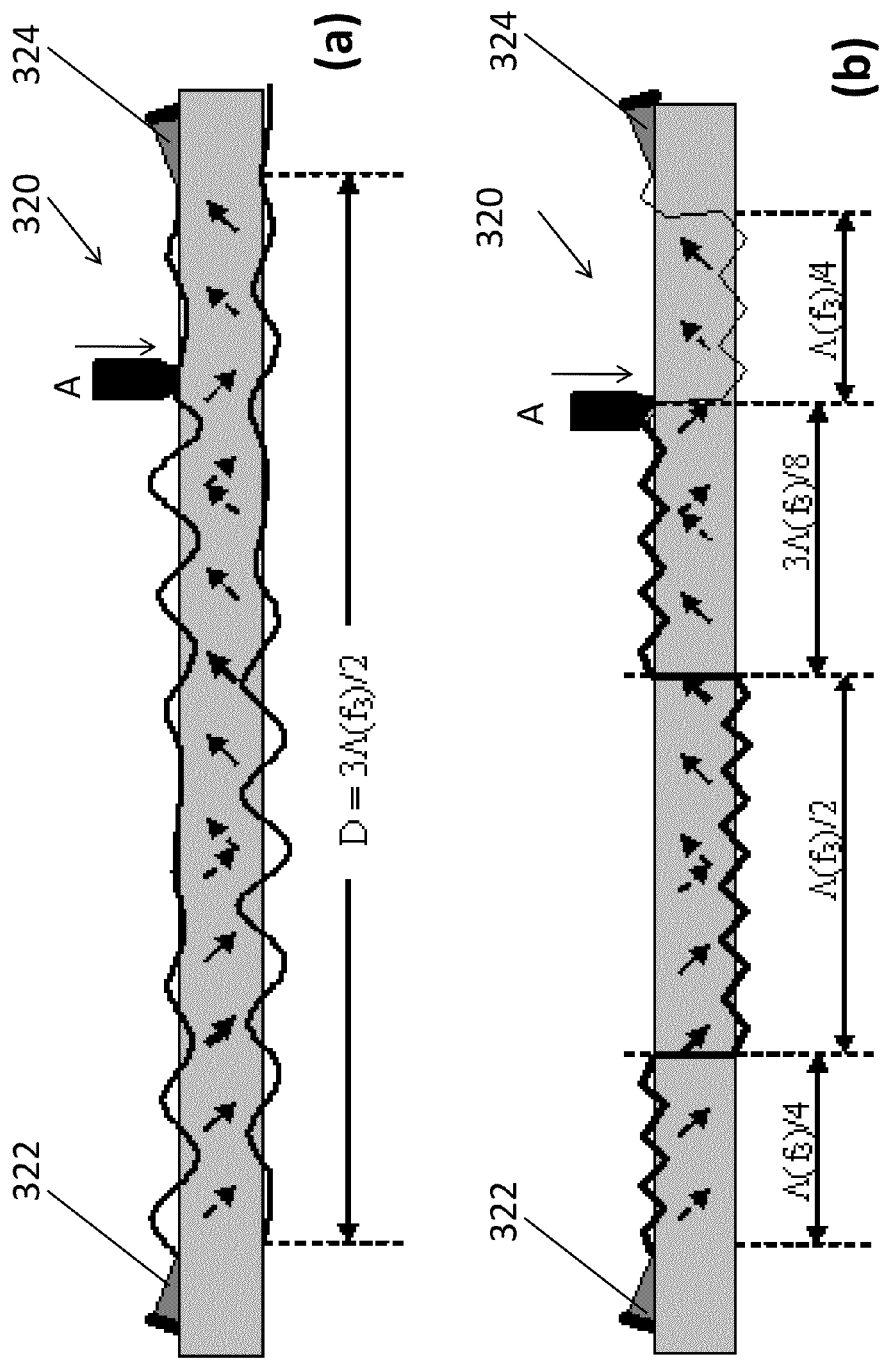
FIGS. 14a and 14b are modifications of FIGS. 13a and 13b, respectively, illustrating top-bottom oscillation phenomenon in a thin substrate.

FIGS. 12-14 assist in outlining some frequency bandwidth issues that may be associated with the design and operation of the sensor 100. Bandwidth issues may arise, for example, in designing a sensor 100 that provides one coordinate via conventional delay time measurements and, simultaneously, an orthogonal coordinate via the use of the top-bottom SAW oscillation phenomenon. They may also arise, for example, in designing a sensor 100 that utilizes short excitation burst lengths to improve coordinate resolution.

FIG. 12 is a modification of FIG. 2 which shows, in schematic notation, the propagating surface acoustic wave only on the surface having the majority of the SAW power of the wave. After the wedge transmit transducer 322 on the thin substrate 320 generates the wave on one surface, the first transition of the majority power surface occurs after a quarter beat wavelength Λ/4 and thereafter the majority of the SAW power of the wave flips between the surfaces after every additional half beat wavelength Λ/2 (which was noted above). An entire top-bottom cycle is one beat wavelength. In FIGS. 13*a* and 13*b*, a receive transducer 324 is added on the top surface at a distance D from the transmit transducer 322. This is illustrated for a frequency $f_3$ selected so that D=(3/2)Λ, that is, the transducer separation is three half beat wavelengths. It is understood that the beat wavelength Λ is a function of frequency f, i.e., Λ=Λ(f). If no touch is present to perturb the surface acoustic waves, there is no signal at the receive transducer 324 since it is on the top surface at a location where all the SAW power (of the wave) is on the bottom surface. At the output of the transmit transducer 322, all of the SAW power is on the top surface. Over the next quarter of a beat wavelength, the percentage of SAW power on the top surface drops from 100% to 50%. Over the next half of a beat wavelength, the percentage of SAW power on the top surface drops further from 50% to 0% and then increases back to 50%. Over the next half of a beat wavelength, the SAW power on the top surface increases from 50% to 100% and then drops back down to 50%. In the remaining quarter of a beat wavelength to the receive transducer 324, the SAW power on the top surface drops from 50% to 0% where all the SAW power is on the bottom surface.

In contrast to the effect of a touch in conventional SAW touchscreens, for the sensors considered herein, the effect of a touch is not only the attenuation of SAW power of the propagating SAW, but generally also a modification of the phase of the top-bottom SAW beat oscillation. This is illustrated in FIGS. 14*a* and 14*b* which show a touch A being applied ⅜ of a beat wavelength after the second transition of the majority SAW power between the top and bottom surfaces. For conceptual simplicity, these figures illustrate the case wherein the touch A completely absorbs all SAW power on the top surface. At this touch location, 85% of the incident SAW power is on the top surface and is completely absorbed while 15% of the incident SAW power is on the bottom surface and continues to propagate (FIG. 14*a* illustrates this with a faintly-drawn zig-zag line). Note that this 15% of the remaining SAW power finds itself entirely on the bottom surface. Following the propagation of the wave with this remaining SAW power after the touch A, over the next quarter beat wavelength the fraction of the remaining SAW power on the top surface increases from 0% to 50% and then grows to 85% at the location of the receive transducer 324. The next effect of the touch A is to increase the received signal power from 0 to 12.5% (=15%×85%) of what the untouched signal would have been with no top-bottom oscillation. In this way, the touch A induces a signal at the receive transducer 324. From the known behavior of SAW oscillation between top and bottom surfaces of a thin substrate, signals can likewise be determined for various strengths and locations of touches as well as various distances between the transducers in units of beat wavelengths.

With the above in mind, measurements for use in the design of the sensor 100 are discussed below so that the bandwidth effects may be understood more clearly. For example, the excitation frequencies for the transmit transducer 322 may be selected so that the respective transducer separation distances D, and thus the corresponding beat wavelength values, provide the SAW power of a wave is entirely on one surface at the location of the receive transducer 324, e.g., where D=nΛ/2, with n being the number of transitions of majority SAW power between surfaces. In this exemplary case, when there is no touch, the receive transducer 324 receives a maximal signal and a corresponding bottom receive transducer (not shown in the figures) receives no signal for even values of n (i.e., for an integer number of beat wavelengths between the transmit and receive transducers 322, 324), For odd values of n (i.e., half integer number of beat wavelengths between the transmit and receive transducers 322, 324), the signals are reversed with the bottom receive transducer receiving a maximal signal and the top receive transducer 322 receiving no signal. A touch perturbs the SAW signals, reducing signal amplitudes that were maximal and increasing signal amplitudes that were zero.

It is clear that well-defined beat wavelength Λ values allow for a useful application by the sensor 100 of top-bottom SAW oscillation. The excitation frequencies may each be within a respective range, or a maximum allowed bandwidth, and still obtain a reasonably well-defined beat wavelength Λ value. Experimental data was collected for the above exemplary case, where D is set to 500 mm and n=1 (and, thus, $\Lambda(f_1)$=2D). The data showed, in part, frequency $f_n$ values of $f_1$=6.960 MHz, $f_2$=6.215 MHz, $f_3$=5.772 MHz, $f_4$=5.454 MHz and $f_5$=5.204 MHz. Estimates of the maximum allowed bandwidth M may then be determined by the relationship $\Delta f_n = (f_n - f_{n+1})/2$, which corresponds to an assumption that the allowed bandwidth can be no larger than half the frequency increment to the next value of n. Note that the larger the value of n, the smaller the excitation frequency $f_n$ required and the smaller the allowed bandwidth $\Delta f_n$. Also note that as the value of n increases, the value of the beat wavelength (Λ) decreases.

The excitation frequency is perfectly well defined (and hence the beat wavelength Λ(f) is also perfectly well defined) when the transmit transducer 322 excitation is an infinitely long duration "continuous" wave or, for practical engineering purposes, is a sufficiently long duration "quasi-continuous" wave. In a typical SAW sensor, the transmit transducer 322 delivers tone bursts of N RF cycles of the nominal excitation frequency f. A minimum burst length $N_{burst}$ may then also be estimated from the maximum allowed bandwidth $\Delta f_n$. Considering that a common estimate of the bandwidth Δf of the tone burst is Δf=f/N, $N_{burst}$ may therefore be expressed as $f_n/\Delta f_n$. In the exemplary case, for values of n from 1 to 5, the minimum burst lengths $N_{burst}$ would be 19, 28, 36, 44 and 51 RF cycles, respectively. A burst excitation is quasi-continuous if the number of RF cycles in the burst $N_{burst}$ is very large compared to the minimum burst lengths. In the exemplary case, for values of n less than a dozen, excitation bursts of one thousand cycles may be considered quasi-continuous; designs using higher values of n appear to require an even greater number of excitation bursts. This creates an apparent design conflict as certain present SAW touchscreen designs utilize burst lengths of 30 RF cycles, with future designs aiming for even shorter burst lengths in order to sharpen touch shadows to improve coordinate resolution and the ability to resolve close touch pairs.

Figure 15:
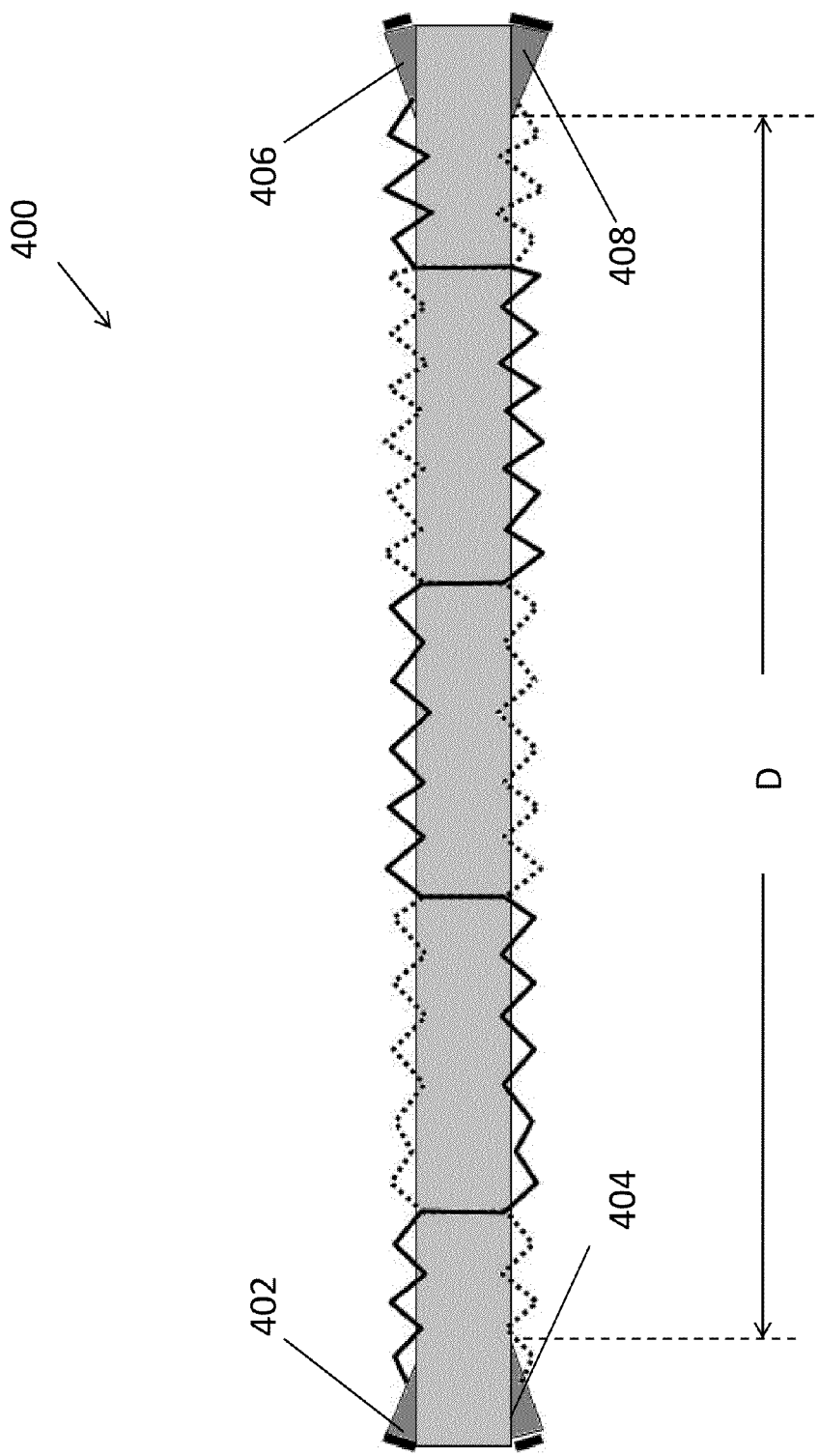
FIG. 15 is a side perspective of another embodiment of an acoustic touch sensor constructed in accordance with the present invention.

FIG. 15 is a side perspective of another embodiment of an acoustic touch sensor 400 constructed in accordance with the present invention that avoids bandwidth issues. The figure illustrates in cross section a 1-D touch sensor 400 formed, for example, of a 500 mm long (D) strip of 1.3 mm thick soda-lime glass and four wedge transducers, namely a top transmit transducer 402, a bottom transmit transducer 404, a top receive transducer 406 and a bottom receive transducer 408. Electronics that can excite either transmit transducer (one at a time) and receive signals from both receive transducers 406, 408 are not shown in the figure for ease of illustration. The figure also illustrates SAW propagation from both the top transmit transducer 402 (solid wavy line) and the bottom transmit transducer 404 (dotted wavy line). These two SAW propagation paths from the two transmit transducers are complementary in the sense that when the majority SAW power is on one surface for one path, the majority SAW power is on the opposite surface for the other path. The majority SAW power of a SAW propagation path is on the top touch surface at a touch location if that SAW path is more perturbed by the touch than its complementary path. Conversely, the majority SAW power is on the bottom surface if the complementary SAW path is more touch sensitive. Note that the sensor 400 avoids certain bandwidth issues by not providing conventional delay time measurements.

Figure 16:
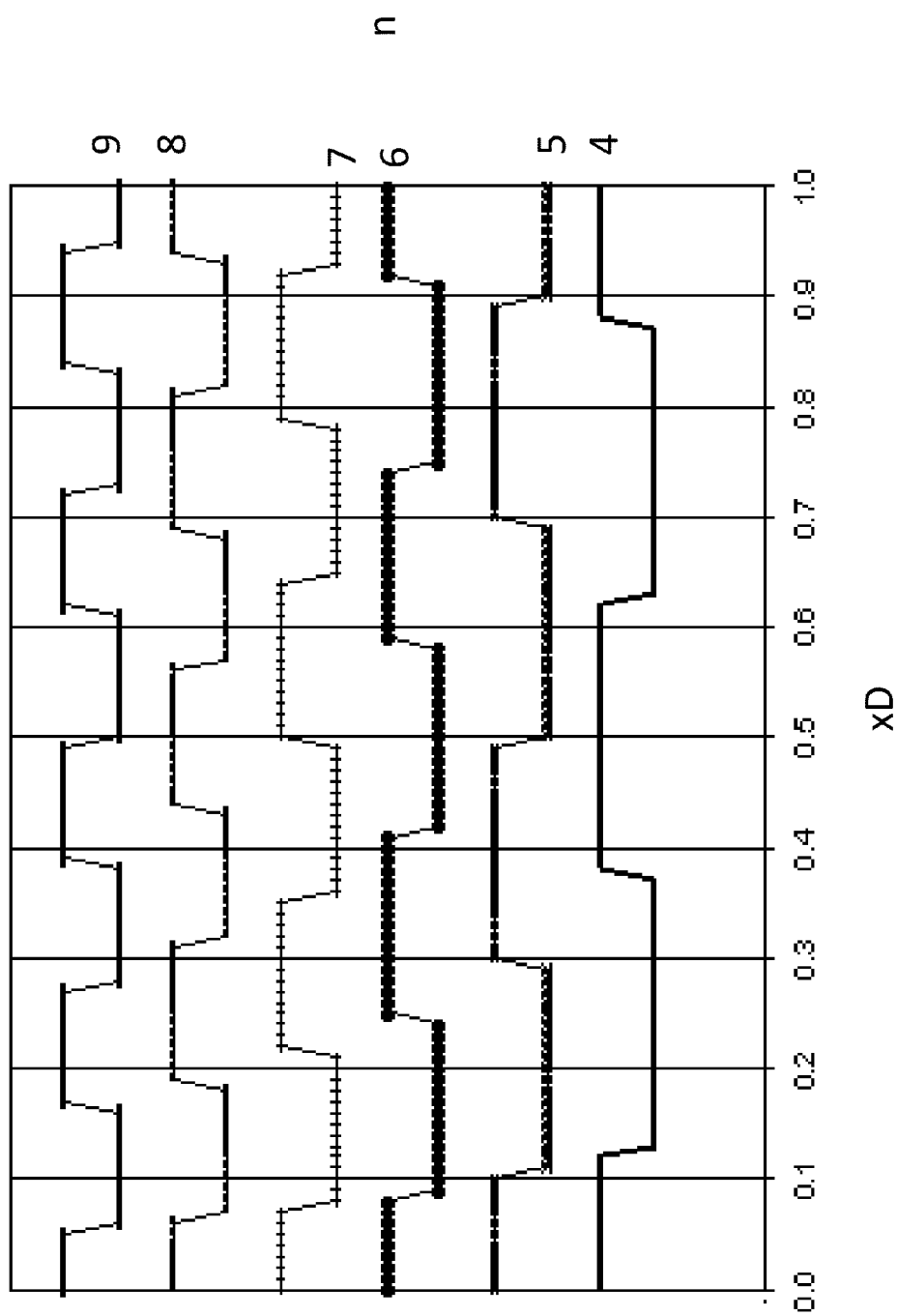
FIG. 16 is a chart illustrating a first principle of operation of the sensor of FIG. 15.

The sensor 400 may use a technique or algorithm that provides touch location information via a "digital fingerprint" for a respective touch. In brief, the top-to-top (top transmit transducer 402 to top receive transducer 406) electronic signal is the complement of the bottom-bottom electronic signal and similarly the top-to-bottom electronic signal is the complement of the bottom-to-top electronic signal. If the top-to-top and/or top-to-bottom signals are more sensitive to a touch than the bottom-to-bottom and bottom-to-top signals, then the touch is in a SAW-on-top zone of the top transmit transducer, otherwise the touch is in a SAW-on-bottom zone of the top transmit transducer. FIG. 16 is a chart illustrating the alternating SAW power of a wave in an exemplary operation of the sensor 400. The horizontal axis is the touch coordinate across the length of the substrate of the sensor 400. The units are scaled from 0<x<1 representing the fraction of the distance from the transmit transducers 402, 404 (i.e., xD). Six curves are shown which are vertically offset from each other for clarity. The six curves are derived from the alternating SAW power during a SAW propagation for the exemplary case described above for different frequencies $f_n$. Curves with n=4 through 9 are displayed because the corresponding frequencies are within the frequency range 5.0 MHz±0.5 MHz, which may be supported by practical transducer design. A high value in a respective curve signifies a SAW-on-top zone and a low value signifies a SAW-on-bottom zone for that respective n. For example, a touch at x=0.4 is in SAW-on-top zones for n of 4, 5, 6 and 9 and is in SAW-on-bottom zones for n of 7 and 8 as may be determined by touch perturbations of signals.

In operation, the sensor 400 (and more specifically the controller electronics) implements the algorithm by applying a quasi-continuous burst (e.g. of 1000 cycles), for the curve with n=4, of frequency $f_4$ to the top transmit transducer 402 and measuring top-top and top-bottom signal amplitudes (relative to non-touch amplitudes). Also, a second quasi-continuous burst of frequency $f_4$ is applied to the bottom transmit transducer 404 and bottom-top and bottom-bottom signal amplitudes are measured. Thereafter, upon a single touch, the sensor 400 determines whether the corresponding curve in FIG. 16 is low or high at the touch location and records the determination as a data bit having a value of 0 or 1, respectively. The sensor 400 repeats these steps for the other frequencies $f_5$ through $f_9$, which only takes a few milliseconds, much faster than the human reaction time in withdrawing the finger touch from the substrate. This process generates a string of data bits (a "bit code"), for example 111001 for a touch at x=0.4. If the touch locations increase from x=0 to x=1, the bit code will take on a sequence of over three dozen different values, namely 111111, 111110, 11100, 111000, 110000, 100000, 000000, 000001, 000011, 000111, 001111, 001110, 011110, . . . 101010. This essentially forms a look up table for touch positions. The sensor 400 may then easily construct a calibration file (borrowing from APR (acoustic pulse recognition) terminology), to match the bit pattern "digital fingerprint" with a corresponding touch position value.

In the above example, the "digital fingerprint" is six bits and, hence, mathematically has 64 possible values. Only 40 of these 64 possible "digital fingerprints" correspond to single touch location values of x in the plot of FIG. 16. Measurement of one of the remaining 24 bit codes might result, for example, from the presence of two or more simultaneous touches. Methods for recognition of the presence of more than one touch may become more useful in cases where the "digital fingerprint" contains more bits. The number of mathematically possible bit patterns or "digital fingerprints" increases exponentially with bit number while the number of single-touch "digital fingerprints" in the 0<x<1 touch location range does not, thus making it less likely for multi-touches to fortuitously generate a valid signal touch "digital fingerprint". Although "digital fingerprints" are conveniently simple, much touch location information is lost in the process of constructing the "digital fingerprints".

Figure 17:
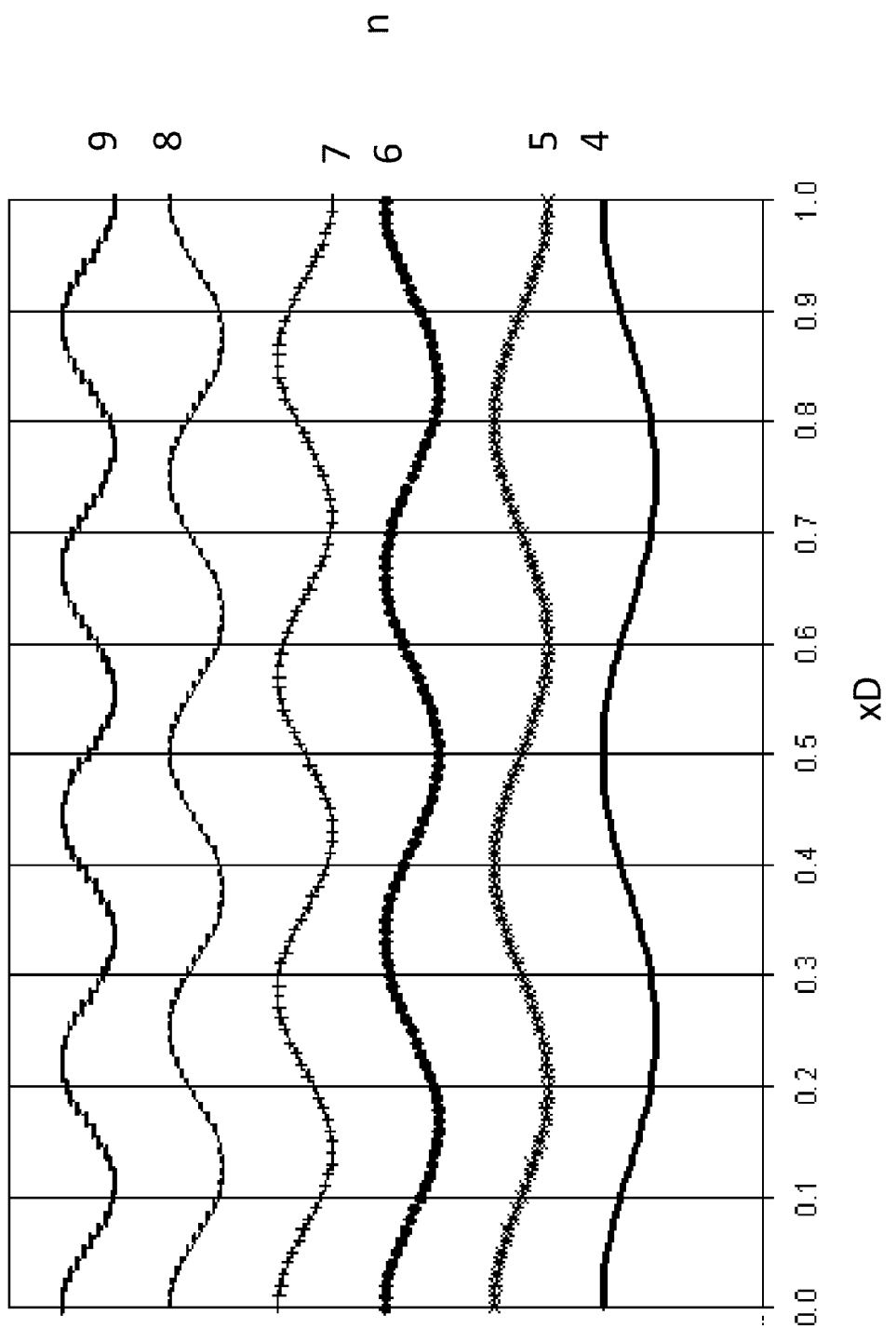
FIG. 17 is a chart illustrating a second principle of operation of the sensor of FIG. 15.

Alternatively, the sensor 400 may use a technique or algorithm that provides touch location information via an "analog fingerprint" for a respective touch, which is much more powerful. Generally, the sensor 400 may obtain a fingerprint that only depends upon touch location, and not the strength of touch, by using ratios or functions of ratios of perturbations experienced by signals and their complementary signals. More specifically, rather than generating one bit of information (0 or 1) by determining whether a signal, such as the top-top $f_4$ signal, is more or less affected by a touch than the complementary signal, such as the bottom-bottom $f_4$ signal, the sensor 400 may generate for each frequency $f_n$ a real number (or complex if signal phases are measured) that is a function of the ratio of the touch-induced perturbation of the signal to the touch-induced perturbation of the complementary signal. This enables construction of a calibration file with only one reference "fingerprint" per value of x on a calibration grid or set of calibration locations. The sensor 400 thus constructs an "analog fingerprint" as a set of six real numbers ($R_4$, $R_5$, $R_6$, $R_7$, $R_8$, $R_9$) where $R_n$ represents the value of a signal-to-complement signal perturbation ratio function for frequency $f_n$. FIG. 17 is similar to FIG. 16 except that each curve represents the continuous variation of the ratio functions $R_4$, $R_5$, $R_6$, $R_7$, $R_8$, $R_9$ rather than jumps between two discrete values, 0 and 1. Note that the ratio functions $R_n$ are shown as sinusoidal curves but may take on other forms.

The sensor 400 may construct or compute a calibration file via simulation or experimentation. In any case, for each index j of a calibration grid, the sensor 400 establishes a reference "analog fingerprint" ($r_4(x_j)$, $r_5(x_j)$, $r_6(x_j)$, $r_7(x_j)$, $r_8(x_j)$, $r_9(x_j)$). In one example, j=0, 1, 2, . . . , J and $x_j$=j/J with J=1000 so that $x_j$=0.000, 0.001, 0.002, . . . 1.000. When the sensor 400 detects a respective touch and determines a live "analog fingerprint" ($R_4$, $R_5$, $R_6$, $R_7$, $R_8$, $R_9$), the value of calibration file index j providing the best match to the previously determined reference "analog fingerprint" ($r_4(x_j)$, $r_5(x_j)$, $r_6(x_j)$, $r_7(x_j)$, $r_8(x_j)$, $r_9(x_j)$) is identified. If the match is of sufficiently good quality, then the touch coordinate is determined to be the value of $x_j$ corresponding to the best match value of j. As with APR acoustic fingerprint matching algorithms, resolution may be improved further with the sensor's 400 use of interpolation algorithms.

The level touch coordinate resolution of "analog fingerprint" algorithms is limited only by the level of noise in the measurements. Advantageously, the ratio functions $R_n$ for larger values of n provide good position resolution even at reasonable levels of electronic noise. Specifically, the error in x coordinate measurement Δx corresponding to ratio function $R_n$ scales with n as Δx~ϵ/n, for a percentage electronic noise level of ϵ. This means the more rapidly the curves in FIG. 17 oscillate (i.e., the larger the n), the less is the uncertainty in the position coordinate x (i.e., xD). This provides a design option that overcomes concerns of using top-bottom SAW oscillation in simpler configurations (e.g., the n=1 case where SAW propagates about one half beat wavelength in crossing the touch area, such as described in the above Son et al. patent application) which may obtain relatively large coordinate errors even for reasonably small levels of electronic noise.

As noted above, in a typical SAW sensor, the transmit transducer 322 delivers tone bursts of N RF cycles of the nominal excitation frequency f and a burst excitation is quasi-continuous if the number of RF cycles in the burst $N_{burst}$ is very large compared to the minimum burst lengths. The sensor 400 may provide a tone burst alternative to quasi-continuous $f_n$ excitations. It is first noted that a tone burst of finite duration contains a spectrum of frequency components over its bandwidth. For example, a 5 RF cycle tone burst has a bandwith of order ⅕ or 20%. Therefore, the 5 RF cycle tone burst with a nominal frequency of 5 MHz will include the frequency range from 4.5 MHz to 5.5 MHz. Such a short tone burst will normally result in complex received signals at the receive transducers 406, 408.

In the digital signal processing by the sensor 400 of these received signals, the received RF waveform may be digitized over the duration of the received signals by providing ADC (analog-to-digital conversion) electronics with a fast enough sampling rate, e.g., 20 MHz. These digitized signals may then be transformed to the frequency domain with an FFT (Fast Fourier Transform). The sensor 400 may then extract signal amplitudes at frequencies $f_4$, $f_5$ . . . $f_9$, compare the amplitudes to amplitudes when no touch was present, and compute signal perturbations that correspond to the respective beat wavelengths Λ($f_4$), Λ($f_5$), . . . Λ($f_9$). Thereafter, the sensor 400 may proceed with the "analog fingerprint" algorithms as described above. The sensor 400 may also undertake an alternative digital signal processing of these received signals. For frequencies between the frequencies $f_4$, $f_5$ . . . $f_9$, the touch area distance D is no longer a half integer number of beat wavelengths and, so, the signals react in even more complex ways to touches. This becomes a benefit since the more complex the fingerprints, the more reliable the matches. The sensor 400 may proceed with the "analog fingerprint" algorithms by replacing the analog fingerprint ($R_4$, $R_5$, $R_6$, $R_7$, $R_8$, $R_9$) with the analog fingerprint (R($f_{k=1}$), R($f_{k=2}$), . . . R($f_{k=K}$)), where k is an index for either a sampling of, or all frequency bins, of frequency $f_k$ of the FFT from k=0, 1, 2, . . . K−1. This obtains intermediate information of the signal perturbation, thus adding to the information for matching purposes.

Figure 18:
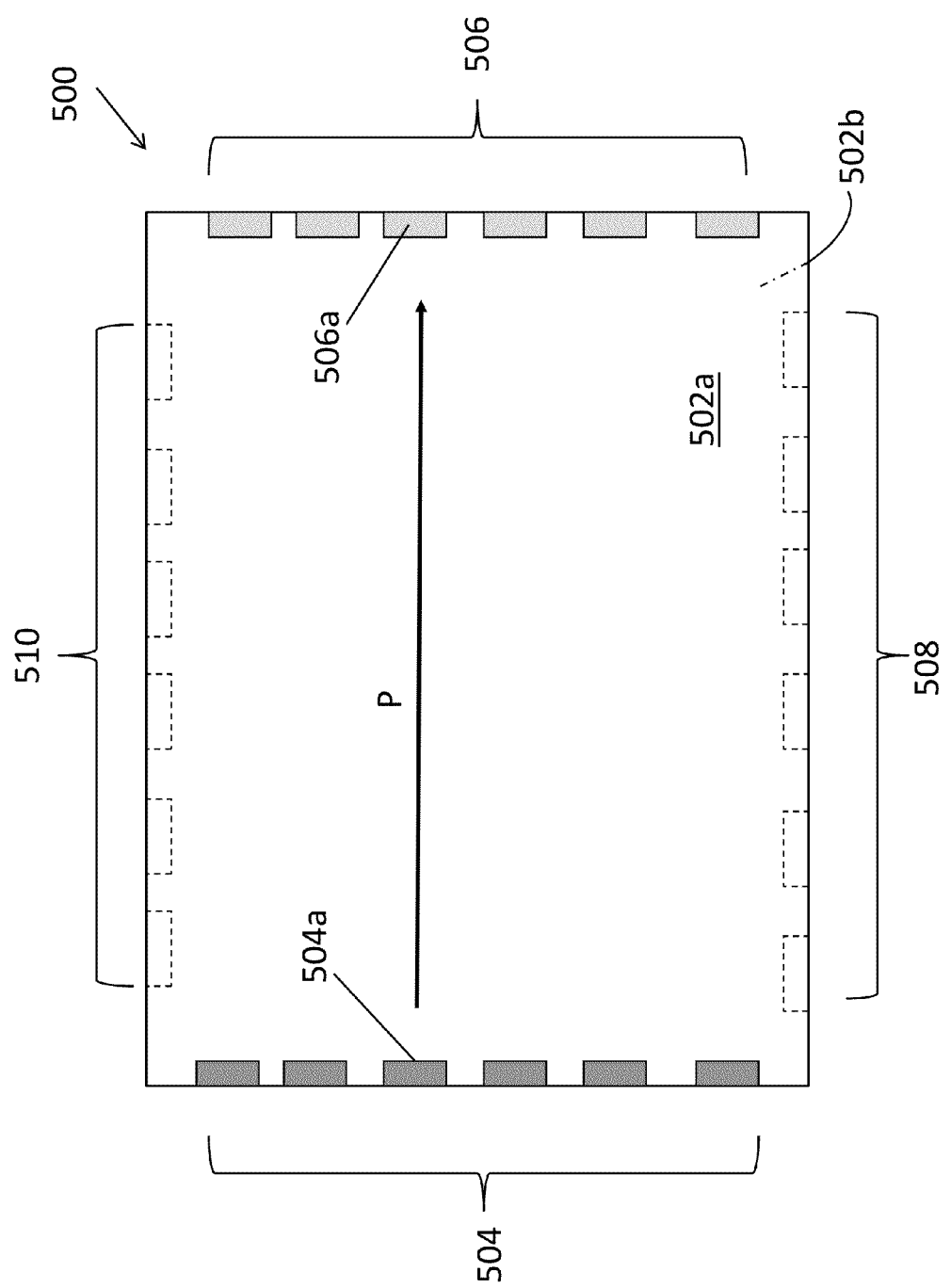
FIG. 18 is a plan view of another embodiment of an acoustic touch sensor constructed in accordance with the present invention.

FIG. 18 is a plan view of a sensor 500 that configures a number of the 1-D sensors 400 to provide 2-D coordinate measurements with obviated bandwidth effects. The sensor 500 comprises a substrate 502, having a top surface 502a and a bottom surface 502b (not visible), that may be formed of appropriate acoustic glass (e.g., soda-lime glass). The sensor 500 also comprises a plurality of transmit transducers 504 on the top and bottom surfaces 502a, 502b and a plurality of receive transducers 506 on the top and bottom surfaces 502a, 502b. Note that each illustrated rectangle represents a respective pair (one on each surface) of transmit transducers 504 and receive transducers 506. The arrow P from the top-bottom transmit transducer pair 504a to the corresponding top-bottom receive transducer pair 506a shows the direction of SAW propagation across the top surface 502a (which, in this case, forms the touch area). Note that each combination of a top-bottom transmit transducer pair with a corresponding top-bottom receive transducer pair corresponds to a 1-D sensor 400 discussed above. In principle, the transducers 504, 506 are sufficient to locate touches in the touch area in two dimensions. The vertical coordinate of a touch is determined by which transducers have touch-perturbed signals and the horizontal coordinate of the touch is determined by any of the top-bottom SAW oscillation based methods described above. For improved resolution, top-bottom transmit transducer pairs 508 and corresponding top-bottom receive transducer pairs 510 to emit and receive SAW propagating in a vertical direction may be added on the top and bottom surfaces 502a, 502b as indicated. Such redundancy of touch coordinate measurement is particularly useful when tracking multiple simultaneous touches. It is understood that although the transducers are illustrated as being well separated from one another, a better touch performance of the entire touch area is obtained if the transducers abut each other or even overlap to avoid dead zones.

Another approach to provide 2-D coordinate measurements with obviated bandwidth effects is illustrated with respect to FIG. 7a. In this approach, the vertical coordinate is determined by standard SAW touchscreen delay-time measurements. For accurate measurement of the vertical coordinate, it is generally preferred that the excitation burst duration be relatively short, such as 30 RF cycles or less. This implies a finite bandwidth of the excitation signal with the beat wavelength $\Lambda(f)$ typically varying significantly over the bandwidth. If the received signals are digitized at a rate of several times the nominal excitation frequency, the sensor may utilize digital signal processing algorithms to divide up the spectral components of the signals in sufficient granularity so that the beat wavelength is more-or-less well defined for each frequency, thus allowing better interpretation and processing of touch-induced signal changes. Furthermore, the frequency variation of touch-induced signal effects provide additional information that may be used to eliminate ambiguities in touch location. As suggested by the 1-D sensor 400 description above, a number of approaches are possible for the processing of digitized signals in order to extract a coordinate in the direction parallel to SAW propagation across the touch area.

Figure 19A:
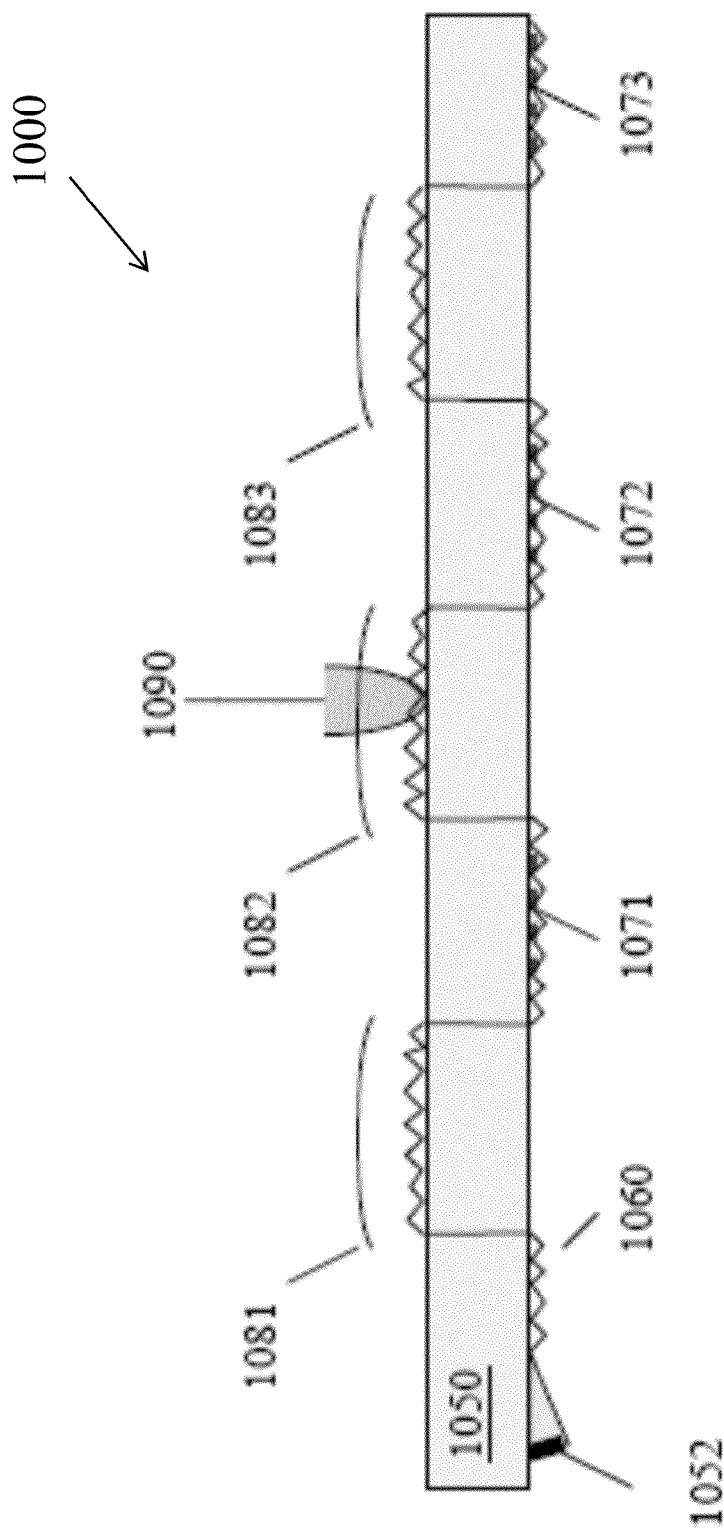
FIG. 19a is a side view of an embodiment of an acoustic touch sensor constructed in accordance with the present invention providing a linear array of touch button locations.

FIG. 19a illustrates an embodiment of an acoustic touch sensor 1000 constructed in accordance with the present invention which provides a linear array of touch buttons. A wedge transmit/receive transducer 1052 is bonded to the bottom surface of a substrate 1050. The thickness of the substrate 1050 is chosen so that the transmitted surface acoustic wave oscillates between the top and bottom surfaces of substrate 1050 as indicated schematically by a wavy line 1060 with a beat wavelength equal to the spacing of desired touch button zones (for example, first, second and third touch button zones 1081, 1082, 1083). At one beat wavelength from the wedge transmit/receive transducer 1052, a first reflective pattern 1071 is fabricated on the bottom surface of substrate 1050 that serves to back reflect a portion of incident SAW energy. For example, the first reflective pattern 1071 may be a screen printed pattern of line segments perpendicular to the SAW propagation direction and with center-to-center spacing equal to one-half of a Rayleigh wavelength. The reflected SAW energy returns to the wedge transducer 1052 to produce a first received signal amplitude peak. FIG. 19b illustrates received signal amplitude (on vertical axis 1120) as a function of delay time (on horizontal axis 1110) of the SAW signal received by the wedge transducer 1052. The first signal amplitude peak 1171 corresponds to the reflection from the first reflective pattern 1071 and corresponds to a delay time equal to twice the beat wavelength divided by the SAW velocity. Second and third reflective patterns 1072, 1073 are placed at distances two and three beat wavelengths from the wedge transducer 1052, respectively, and result in second and third received amplitude signal peaks 1172a, 1173a, respectively, in the absence of a touch. The reflective patterns 1071, 1072, 1073 may be similarly constructed, preferably with increasing reflective strength to equalize amplitudes of the signal amplitude peaks 1171, 1172a, 1173a.

FIG. 19a illustrates a touch 1090 on the top surface of the substrate 1050, for example, in the second touch button zone 1082. The touch 1090 attenuates SAW signals traveling to and from the second and third reflective patterns 1072, 1073, but not the first reflective pattern 1071, resulting in the second and third received signal amplitude peaks 1172a, 1173a being reduced to smaller respective signal amplitude peaks 1172b, 1173b, while the first signal amplitude peak 1171 remains unchanged. More generally, a touch in the first touch button zone 1081 will attenuate all three peaks in FIG. 19b, a touch in the second touch button zone 1082 will attenuate only the second and third peaks, as illustrated in FIG. 19b, and a touch in the third touch button zone 1083 will only attenuate the third signal peak with the longest delay time. Thus the receive signal allows recognition of both the presence of a touch as well as a determination of which touch button zone was touched. In alternate embodiments, the number of touch button zones may be greater or less than three via addition or elimination of reflective patterns. The top surface of the touch sensor of FIG. 19a is the intended touch surface with the touch button zones 1081, 1082, 1083 and is completely free of any obstructions or parts vulnerable to impact and breakage. The transducer 1052 and the reflective patterns, as well as any associated wiring and electronics may be neatly hidden and safely protected behind the touch substrate 1050. If the substrate 1050 is not an opaque material such as a metal, but rather a clear material like glass, a benign opaque coating may be added to the bottom surface of substrate 1050 for cosmetic purposes. Also note that the transmit/receive transducer 1052 may be a unitary element or separate transmit and receive transducers.

Figure 20B:
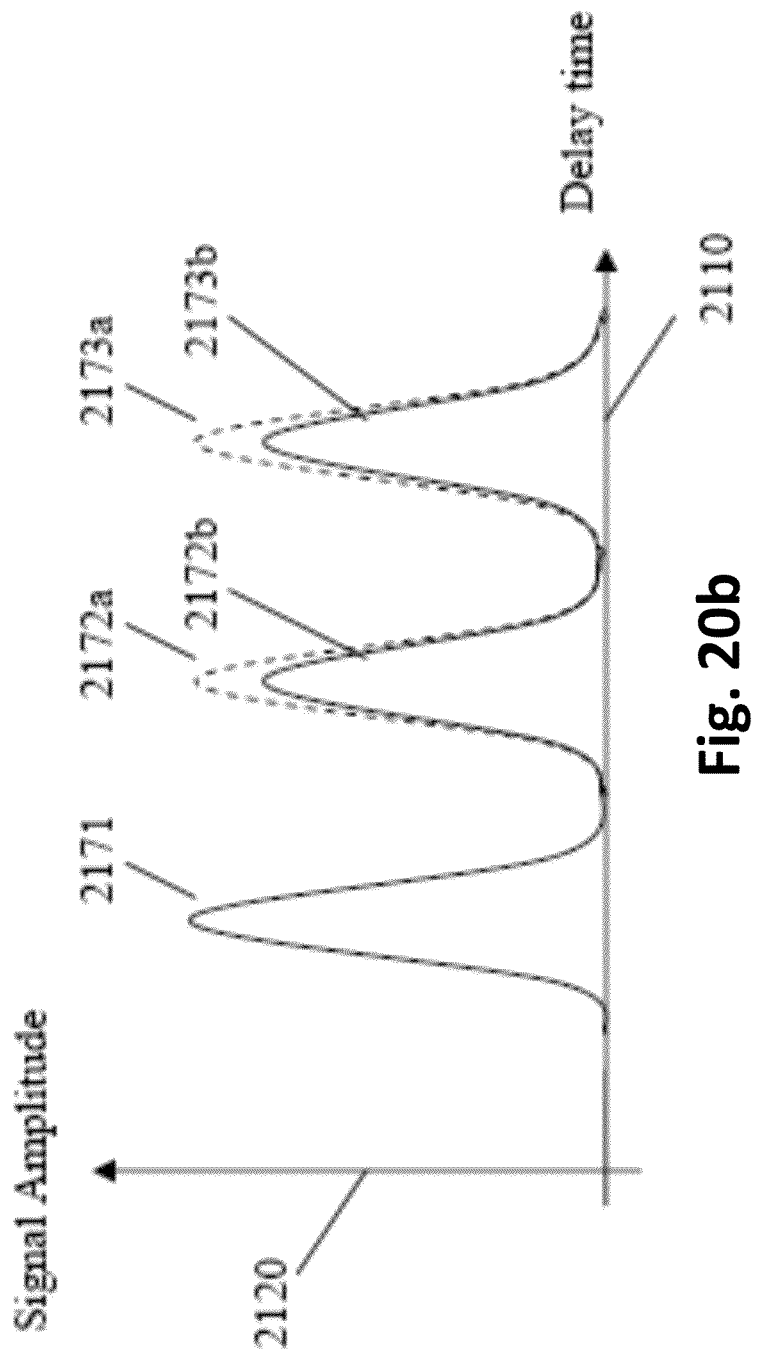

FIG. 20a shows an alternate embodiment of an acoustic touch sensor 2000 which provides a linear array of touch buttons. The sensor 2000 is in many ways similar to that of the sensor 1000 shown in FIG. 19a, but with a major difference in that a transmit/receive transducer 2052 transmits and receives plate waves rather than SAW. The emitted plate wave 2060 may be any Lamb mode or shear mode. For reasons of simplicity and water immunity, the plate wave 2060 is most preferably the lowest order shear plate wave, also referred to as an n=0 shear wave and, in some commercial contexts, also as a "guided acoustic wave" or "GAW". Plate waves do not oscillate between bottom and top surfaces like SAW, but rather continuously couple to both top and bottom surfaces while propagating energy through the entire thickness of the substrate 2050. Reflective patterns 2071, 2072, 2073 reflect back portions 2061, 2062, 2063 of the transmitted wave 2060 which are then received by the transducer 2052. The touch button zones 2081, 2082, 2083 are defined by the substrate spaces between the transducer 2052 and the reflective patterns 2071, 2072, 2073. Like the plot of FIG. 19b, the plot of FIG. 20b illustrates the signal amplitude (on vertical axis 2120) of the received signal as a function of the delay time (on horizontal axis 2110). Again, in the absence of a touch, there are three signal amplitude peaks 2171, 2712a 2173a that correspond to the reflections from the respective reflective patterns 2071, 2072, 2073. A touch 2090 in the second touch button zone 2082 attenuates the second and third signal amplitude peaks 2172a, 2173a resulting in respective attenuated signal amplitude peaks 2172b, 2173b, while the first signal amplitude peak 2171 remains unchanged. More generally, a touch in the first touch button zone 2081 will attenuate all three peaks in FIG. 20b, a touch in the second touch button zone 2082 will attenuate only the second and third peaks, as illustrated in FIG. 20b, and a touch in the third touch button zone 2083 will only attenuate the third signal peak with the longest delay time. As plate waves tend to be less sensitive to touch than surface acoustic waves, the degree of attenuation may be reduced as suggested by a comparison of FIGS. 19b and 20b. Again, the design of the substrate 2000 can be generalized to more or less than three touch button zones. Again, the touch surface is free of obstructions and all delicate components and electronics may be mounted or fabricated on the bottom surface of substrate 2050. Also, the transmit/receive transducer 2052 may be a unitary element or separate transmit and receive transducers. The touch sensor of FIG. 20a may be particularly well suited to thin stainless steel substrates commonly used in the construction of appliances.

Other modifications are possible within the scope of the invention. For example, in each embodiment described, the substrate may take on various sizes and shapes depending upon engineering or application considerations. Moreover, the substrate may be adapted to optimize either the energy transfer, the maintenance of propagation on a respective surface, or both. The substrate may also take on different compositions other than glass, such as aluminum or stainless steel, that can facilitate both the maintenance of propagating surface acoustic waves and the transfer of propagating surface acoustic waves from one surface, through the substrate, to the other surface, as desired.

Also, the sensors may utilize various means to affect the energy transfer or the maintenance of propagation on a respective surface. Also, as noted above, depending upon various factors, the substrate may utilize different thicknesses to maintain surface acoustic waves propagating on a respective surface and as well as utilize different thicknesses to convert a top surface acoustic wave into a bottom surface acoustic wave (and vice versa).

What is claimed:

1. An acoustic touch sensor system having multi-touch capability, comprising:
   a substrate adapted to propagate surface acoustic waves along opposite surfaces and to transfer, through the substrate, surface acoustic waves between the surfaces and to form a touch sensitivity pattern on a touch region on one of the opposite surfaces based on alternating surface acoustic waves propagating through the touch region;
   a transmitter-reflector arrangement adapted to transmit surface acoustic waves on each opposite surface;
   a receiver-reflector arrangement adapted to receive surface acoustic waves from each opposite surface and to produce a touch response signal in response to a touch on the touch region; and
   a controller that operates on the touch response signals and determines positional information of the touch on the touch region from the touch response signals.

2. The system of claim 1, wherein the touch sensitivity pattern defines a probable zone of touch for each alternating surface acoustic wave propagating through the touch region that permits the controller to distinguish between touches in different zones and between touches in different touch region locations of the same zone.

3. An acoustic touch sensor system, comprising:
   a substrate having a first surface with a touch region and a second surface opposite the first surface, the substrate being adapted to propagate surface acoustic waves along each of the surfaces and to transfer, through the substrate, surface acoustic waves between the surfaces;
   a transmitter adapted to transmit respective surface acoustic waves on each surface that alternate propagating in the touch region as the surface acoustic waves transfer between the surfaces;
   a receiver adapted to receive surface acoustic waves from each surface and to produce touch response signals in response to a touch on the touch region; and
   a controller that operates on the touch response signals and determines positional information of a respective touch on the touch region from the touch response signals.

4. The system of claim 3, wherein the controller determines a first positional coordinate of the touch on the touch region based on delay time measurements of received surface acoustic waves and a second positional coordinate, orthogonal to the first positional coordinate, based on perturbation measurements of the alternating propagating surface acoustic waves.

5. The system of claim 3, wherein the controller determines a positional coordinate of the touch on the touch region, relative to the transmitter position, based on perturbation measurements of the alternating propagating surface acoustic waves.

6. The system of claim 3, wherein the controller measures, for each of a plurality of transmitting frequencies, perturbations of the alternating propagating surface acoustic waves in response to the touch on the touch region to determine a positional coordinate of the touch on the touch region relative to the transmitter position, a respective positional coordinate being identified with a specific pattern of measurements across the plurality of transmitting frequencies.

7. The system of claim 3, wherein the transmitter is adapted to transmit over a range of transmitting frequencies, an alternating propagation pattern being formed in the touch region for a respective transmitting frequency in the range, and the controller is adapted to correspond a touch position on the touch region with a respective sequence of coded values derived from the alternating propagation patterns formed in the touch region for a plurality of transmitting frequencies in the range.

8. The system of claim 7, wherein a coded value for a respective alternating propagation pattern represents whether the surface acoustic wave transmitted on the first surface or the surface acoustic wave transmitted on the second surface is more touch sensitive at a respective touch position in the touch region.

9. The system of claim 7, wherein a coded value for a respective alternating propagation pattern represents a function of the ratio of a touch-induced perturbation of the surface acoustic wave transmitted on the first surface to a touch-induced perturbation of the surface acoustic wave transmitted on the second surface at a respective touch position in the touch region.

10. The system of claim 9, wherein the coded values for a respective alternating propagation pattern across touch positions in the touch region form a continuous curve of ratio functions.

11. The system of claim 3, wherein the transmitter is adapted to transmit in tone bursts of finite duration for a respective excitation frequency of the transmitter and the controller is adapted to undertake digital signal processing of the touch response signals and non-touch response signals provided by the receiver to obtain perturbation information of the alternating propagating surface acoustic waves.

12. The system of claim 3, wherein said system further comprises a transmitter and an associated receiver for each axis coordinate of the touch region and wherein the controller determines a first axis coordinate of the touch on the touch region based on perturbation measurements of the alternating propagating surface acoustic waves transmitted and received in the first axis coordinate direction and a second axis coordinate of the touch on the touch region based on perturbation measurements of the alternating propagating surface acoustic waves transmitted and received in the second axis coordinate direction.

* * * * *